United States Patent
Kimoto et al.

(10) Patent No.: US 11,201,238 B2
(45) Date of Patent: Dec. 14, 2021

(54) SEMICONDUCTOR DEVICE, METHOD OF MANUFACTURING SEMICONDUCTOR DEVICE, INVERTER CIRCUIT, DRIVING DEVICE, VEHICLE, AND ELEVATOR

(71) Applicant: KABUSHIKI KAISHA TOSHIBA, Minato-ku (JP)

(72) Inventors: Shinichi Kimoto, Tsukuba (JP); Katsuhisa Tanaka, Tsukuba (JP); Shinya Kyogoku, Yokohama (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 14 days.

(21) Appl. No.: 16/797,048

(22) Filed: Feb. 21, 2020

(65) Prior Publication Data
US 2021/0083099 A1    Mar. 18, 2021

(30) Foreign Application Priority Data
Sep. 13, 2019 (JP) .............................. JP2019-167647

(51) Int. Cl.
*H01L 29/78*    (2006.01)
*H01L 29/12*    (2006.01)
(Continued)

(52) U.S. Cl.
CPC ...... *H01L 29/7813* (2013.01); *H01L 29/0869* (2013.01); *H01L 29/1095* (2013.01);
(Continued)

(58) Field of Classification Search
CPC ............. H01L 29/1095; H01L 29/1608; H01L 29/41766; H01L 29/66734; H01L 29/7813; H01L 29/7802–7815
See application file for complete search history.

(56) References Cited

U.S. PATENT DOCUMENTS

2008/0217684 A1* 9/2008 Hashimoto ..... H01L 21/823437
257/334
2008/0299727 A1* 12/2008 Mizokuchi ........ H01L 29/66727
438/270
(Continued)

FOREIGN PATENT DOCUMENTS

JP            5767869 B2    8/2015
JP        2017-168520 A    9/2017
(Continued)

*Primary Examiner* — Eric A. Ward
(74) *Attorney, Agent, or Firm* — Oblon, McClelland, Maier & Neustadt, L.L.P.

(57) ABSTRACT

A semiconductor device according to an embodiment includes: a silicon carbide layer having a first plane, a second plane facing the first plane, a first trench, a second trench, an n-type first silicon carbide region, a p-type second silicon carbide region between the first silicon carbide region and the first plane, an n-type third silicon carbide region between the second silicon carbide region and the first plane, and a p-type fourth silicon carbide region between the second trench and the first silicon carbide region; a gate electrode being located in the first trench; a gate insulating layer; a first electrode, a portion of the first electrode being located in the second trench; a second electrode; and an interlayer insulating layer being located between the gate electrode and the first electrode, in which an interface between the first electrode and the interlayer insulating layer is located in the first trench.

12 Claims, 26 Drawing Sheets

(51) Int. Cl.

| | | |
|---|---|---|
| *H01L 29/417* | (2006.01) | |
| *H01L 29/10* | (2006.01) | |
| *H01L 29/08* | (2006.01) | |
| *H01L 29/16* | (2006.01) | |
| *H01L 29/66* | (2006.01) | |
| *H01L 21/04* | (2006.01) | |

(52) U.S. Cl.
CPC .... *H01L 29/1608* (2013.01); *H01L 29/41741* (2013.01); *H01L 29/41775* (2013.01); *H01L 29/66068* (2013.01); *H01L 21/047* (2013.01)

(56) References Cited

U.S. PATENT DOCUMENTS

| | | |
|---|---|---|
| 2015/0236119 A1 | 8/2015 | Tanaka et al. |
| 2017/0263714 A1 | 9/2017 | Ogura et al. |
| 2018/0002591 A1 | 1/2018 | Ohashi et al. |
| 2019/0074372 A1* | 3/2019 | Kobayashi ........ H01L 21/26513 |
| 2019/0172910 A1* | 6/2019 | Siemieniec ......... H01L 29/0623 |

FOREIGN PATENT DOCUMENTS

| | | |
|---|---|---|
| JP | 2018-014455 A | 1/2018 |
| WO | WO 2014/061367 A1 | 4/2014 |
| WO | WO 2017/126472 A1 | 7/2017 |

* cited by examiner

SEMICONDUCTOR DEVICE, METHOD OF MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-167647, filed on Sep. 13, 2019, the entire contents of which are incorporated herein by reference.

FIELD

Embodiments described herein relate generally to a semiconductor device, a method of manufacturing a semiconductor device, an inverter circuit, a driving device, a vehicle, and an elevator.

BACKGROUND

Silicon carbide (SiC) is expected as a material for next-generation semiconductor devices. The silicon carbide has excellent physical properties such as a band gap of about 3 times, a breakdown field strength of about 10 times, and a thermal conductivity of about 3 times as compared with silicon. By utilizing these physical properties, it is possible to realize a semiconductor device capable of operating at a low loss and at a high temperature.

In a vertical-type metal oxide semiconductor field effect transistor (MOSFET), a trench gate structure in which a gate electrode is provided in a trench is applied in order to realize a low on-resistance. By applying the trench gate structure, the channel area per unit area increases, and the on-resistance is reduced.

DETAILED DESCRIPTION

Figure 1:
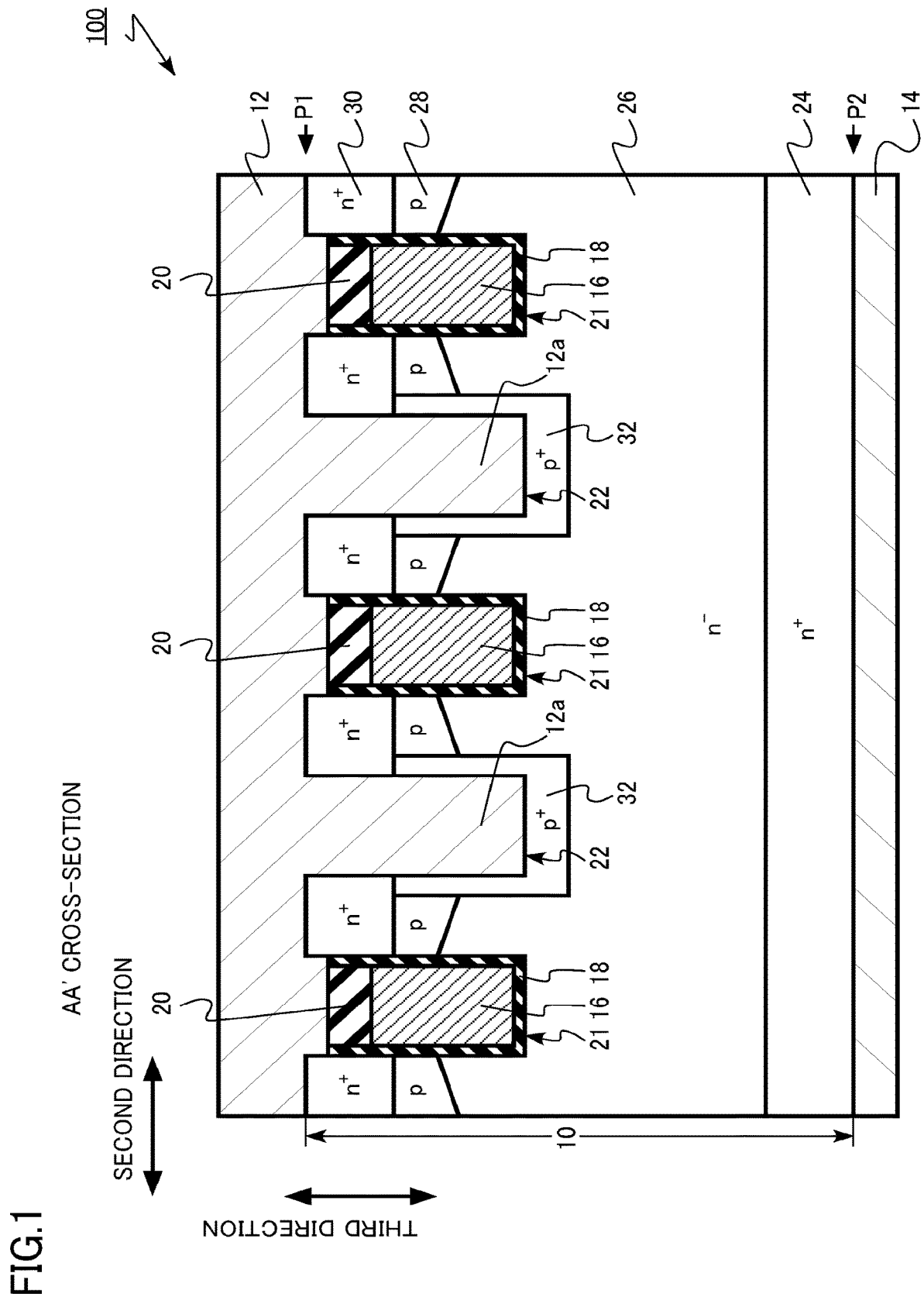
FIG. 1 is a schematic cross-sectional view of a semiconductor device according to a first embodiment.

A semiconductor device according to an embodiment includes: a silicon carbide layer having a first plane parallel to a first direction and a second direction perpendicular to the first direction and a second plane facing the first plane, the silicon carbide layer having a first trench being located on a side of the first plane and extending in the first direction, a second trench being located on the side of the first plane and extending in the first direction, a first silicon carbide region of n-type, a second silicon carbide region of p-type being located between the first silicon carbide region and the first plane and being located between the first trench and the second trench, a third silicon carbide region of n-type being located between the second silicon carbide region and the first plane and being located between the first trench and the second trench, and a fourth silicon carbide region of p-type being located between the second trench and the first silicon carbide region, the fourth silicon carbide region being located between the second trench and the second silicon carbide region, and the fourth silicon carbide region having higher p-type impurity concentration than the second silicon carbide region; a gate electrode being located in the first trench; a gate insulating layer being located between the gate electrode and the silicon carbide layer; a first electrode being located on a side of the first plane of the silicon carbide layer, a portion of the first electrode being located in the second trench, and a portion of the first electrode being in contact with the third silicon carbide region and the fourth silicon carbide region; a second electrode being located on a side of the second plane of the silicon carbide layer; and an interlayer insulating layer being located between the gate electrode and the first electrode. An interface between the first electrode and the interlayer insulating layer is located in the first trench.

Hereinafter, embodiments will be described with reference to the drawings. In addition, in the following description, the same or similar members are denoted by the same reference numerals, and the description of the members or the like that have been described once is omitted as appropriate.

In addition, in the following description, the notations $n^+$, n, $n^-$ and $p^+$, p, $p^-$ represent the relative levels of the impurity concentrations in the respective conductivity types. That is, $n^+$ represents to be relatively higher in the n-type impurity concentration than n, and $n^-$ represents to be relatively lower in the n-type impurity concentration than n. In addition, $p^+$ represents to be relatively higher in the p-type impurity concentration than p, and $p^-$ represents to be relatively lower in the p-type impurity concentration than p. In addition, in some cases, the $n^+$-type and the $n^-$-type may be simply referred to as the n-type and the $p^+$-type and $p^-$-type may be simply referred to as the p-type.

The impurity concentration can be measured by, for example, secondary ion mass spectrometry (SIMS). In addition, the relative level of the impurity concentration can be determined from the level of the carrier concentration obtained by, for example, scanning capacitance microscopy (SCM). In addition, the distance such as the width and depth of the impurity region can be obtained by, for example, SIMS. In addition, the distance such as the width and depth of the impurity region can be obtained from, for example, an SCM image.

The depth of the trench, the thickness of the insulating layer, and the like can be measured on images of, for example, SIMS, a transmission electron microscope (TEM).

In this specification, the "p-type impurity concentration" of the p-type silicon carbide region denotes a net p-type impurity concentration obtained by subtracting the n-type impurity concentration of the region from the p-type impurity concentration of the region. In addition, the "n-type impurity concentration" of the n-type silicon carbide region denotes a net n-type impurity concentration obtained by subtracting the p-type impurity concentration of the region from the n-type impurity concentration of the region.

First Embodiment

A semiconductor device according to a first embodiment includes: a silicon carbide layer having a first plane parallel to a first direction and a second direction perpendicular to the first direction and a second plane facing the first plane, the silicon carbide layer having a first trench being located on a side of the first plane and extending in the first direction, a second trench being located on the side of the first plane and extending in the first direction, a first silicon carbide region of n-type, a second silicon carbide region of p-type being located between the first silicon carbide region and the first plane and being located between the first trench and the second trench, a third silicon carbide region of n-type being located between the second silicon carbide region and the first plane and being located between the first trench and the second trench, and a fourth silicon carbide region of p-type being located between the second trench and the first silicon carbide region, the fourth silicon carbide region being located between the second trench and the second silicon carbide region, and the fourth silicon carbide region having higher p-type impurity concentration than the second silicon carbide region; a gate electrode being located in the first trench; a gate insulating layer being located between the gate electrode and the silicon carbide layer; a first electrode being located on a side of the first plane of the silicon carbide layer, a portion of the first electrode being located in the second trench, and a portion of the first electrode being in contact with the third silicon carbide region and the fourth silicon carbide region; a second electrode being located on a side of the second plane of the silicon carbide layer; and an interlayer insulating layer being located between the gate electrode and the first electrode. An interface between the first electrode and the interlayer insulating layer is located in the first trench.

The semiconductor device according to the first embodiment is a vertical-type MOSFET 100 using silicon carbide. The MOSFET 100 is a MOSFET having a trench gate structure in which a gate electrode is provided in a trench. The MOSFET 100 is a MOSFET having a so-called double trench structure in which a source electrode is provided in a trench. The MOSFET 100 is an n-channel MOSFET using electrons as carriers.

Figure 2:
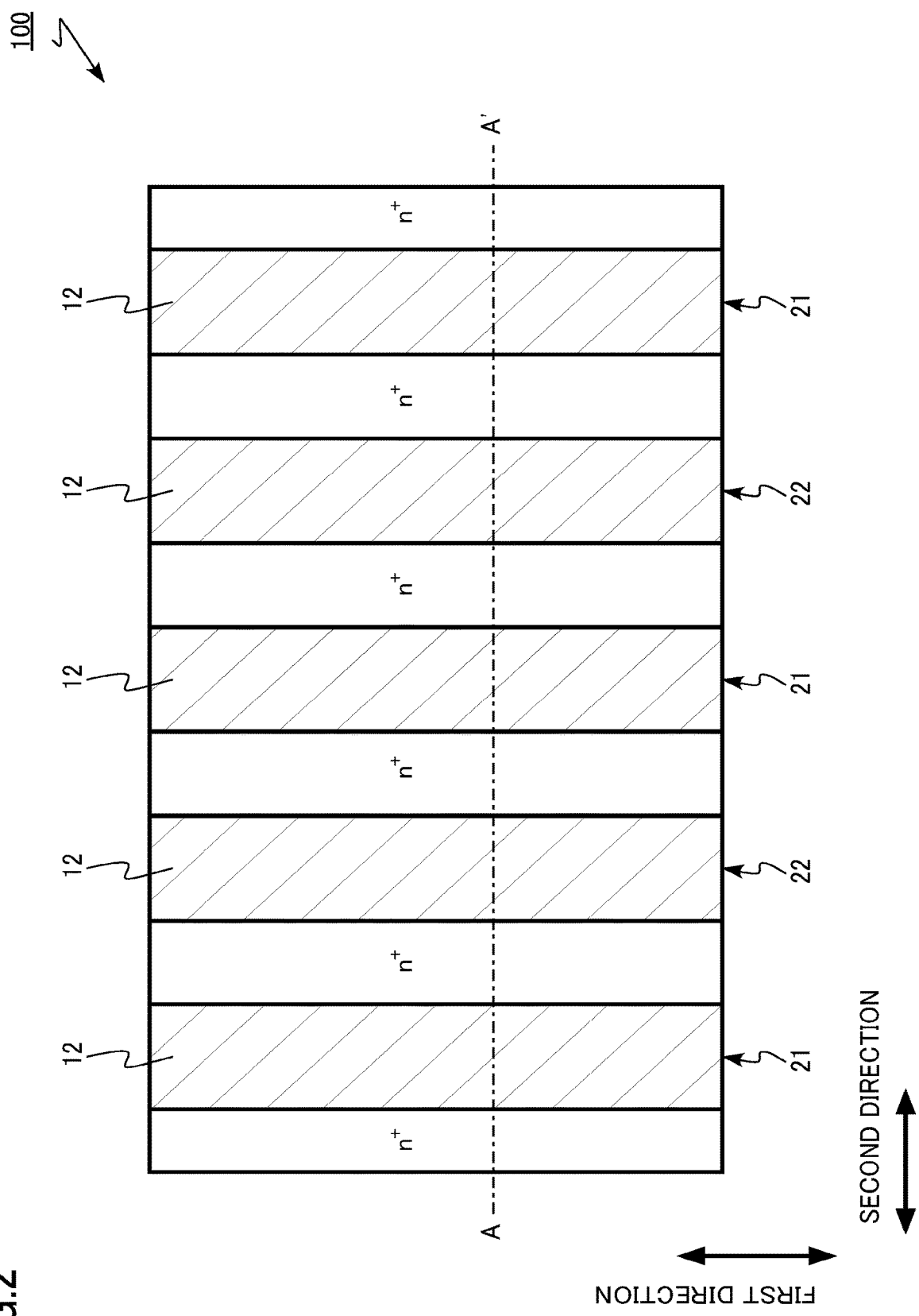
FIG. 2 is a schematic plan view of the semiconductor device according to the first embodiment.
Figure 3:
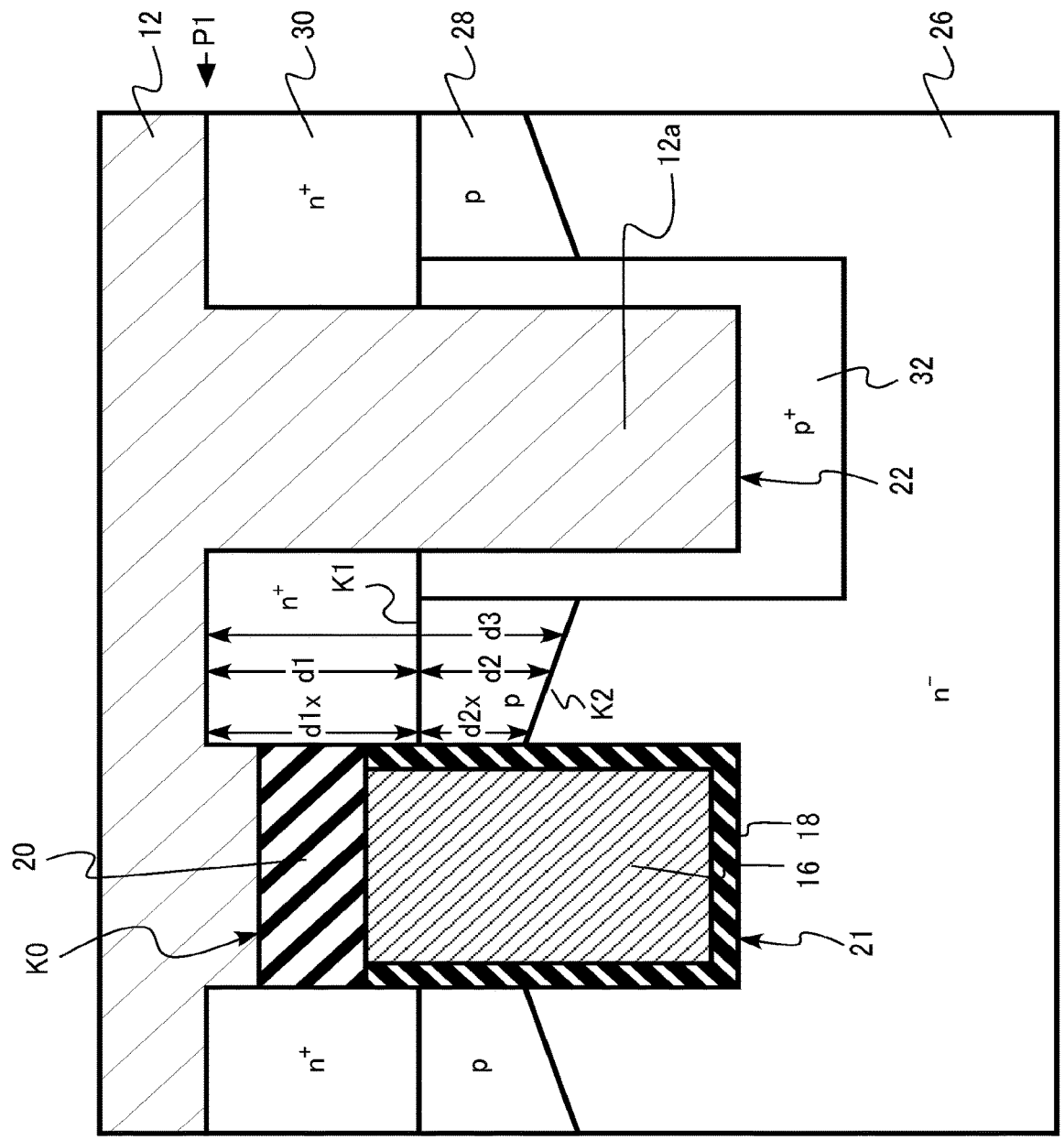
FIG. 3 is an enlarged schematic cross-sectional view of the semiconductor device according to the first embodiment.

FIG. 1 is a schematic cross-sectional view of the semiconductor device according to the first embodiment. FIG. 2 is a schematic plan view of the semiconductor device according to the first embodiment. FIG. 3 is an enlarged schematic cross-sectional view of the semiconductor device according to the first embodiment.

FIG. 1 is an AA' cross-sectional view of FIG. 2. FIG. 2 illustrates a pattern on the first plane P1 of FIG. 1. FIG. 3 is an enlarged view of a portion of FIG. 1.

The MOSFET 100 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 includes a gate trench 21 (first trench), a contact trench 22 (second trench), an $n^+$-type drain region 24, an $n^-$-type drift region 26 (first silicon carbide region), a p-type body region 28 (second silicon carbide region), an $n^+$-type source region 30 (third silicon carbide region), and a $p^-$-type electric field relaxation region 32 (fourth silicon carbide region).

The silicon carbide layer 10 is located between the source electrode 12 and the drain electrode 14. The silicon carbide layer 10 has a first plane ("P1" in FIG. 1) and a second plane ("P2" in FIG. 1). Hereinafter, the first plane P1 is also referred to as a front surface, and the second plane P2 is also referred to as a back surface. The second plane P2 faces the first plane P1.

The first direction and the second direction are directions parallel to the first plane P1. The second direction is a direction perpendicular to the first direction. In addition, the third direction is a direction perpendicular to the first plane. The third direction is a direction perpendicular to the first direction and the second direction.

Hereinafter, "depth" denotes a depth based on the first plane P1.

The silicon carbide layer 10 is single crystal SiC. The silicon carbide layer 10 is, for example, 4H—SiC. The silicon carbide layer 10 has a thickness of, for example, 5 μm or more and 500 μm or less.

The first plane P1 is, for example, a plane inclined at 0 degree or more and 8 degrees or less with respect to the (0001) face. That is, the first plane P1 is a plane of which normal line is inclined at 0 degree or more and 8 degrees or less with respect to the c-axis in the [0001] direction. In other words, the off angle with respect to the (0001) face is 0 degree or more and 8 degrees or less. In addition, the second plane P2 is, for example, a plane inclined at 0 degree or more and 8 degrees or less with respect to the (000-1) face.

The (0001) face is called a silicon face. The (000-1) face is called a carbon face. The inclination direction of the first plane P1 and the second plane P2 is, for example, the [11-20] direction. The [11-20] direction is the a-axis direction. In FIGS. 1 and 2, for example, the second direction illustrated in the figures is the a-axis direction.

The gate trench 21 exists in the silicon carbide layer 10. The gate trench 21 is located on the side of the silicon carbide layer 10 closer to the first plane P1. The gate trench 21 is a groove formed in the silicon carbide layer 10.

The gate trench 21 extends in the first direction as illustrated in FIG. 2. The gate trench 21 has a stripe shape as illustrated in FIG. 2.

The gate trenches 21 are repeatedly arranged in the second direction as illustrated in FIGS. 1 and 2. The depth of the gate trench 21 is, for example, 1 μm or more and 2 μm or less. The width of the gate trench 21 in the second direction is, for example, 0.5 μm or more and 1 μm or less.

The gate trench 21 penetrates the source region 30 and the body region 28.

The contact trench 22 exists in the silicon carbide layer 10. The contact trench 22 is located on the side of the silicon carbide layer 10 closer to the first plane P1. The contact trench 22 is a groove formed in the silicon carbide layer 10.

The contact trench 22 extends in the first direction as illustrated in FIG. 2. The contact trench 22 has a stripe shape as illustrated in FIG. 2.

The contact trenches 22 are repeatedly arranged in the second direction as illustrated in FIGS. 1 and 2, and the depth of the contact trench 22 is, for example, 1 μm or more and 2 μm or less. The width of the contact trench 22 in the second direction is, for example, 0.5 μm or more and 1 μm or less.

The contact trench 22 penetrates the source region 30 and the body region 28.

The contact trench 22 is provided between the two gate trenches 21. The width of the contact trench 22 in the second direction and the width of the gate trench 21 in the second direction are, for example, equal.

The depth of the contact trench 22 and the depth of the gate trench 21 are, for example, substantially equal. In other words, the distance from the second plane P2 to the gate trench 21 is substantially equal to the distance from the second plane P2 to the contact trench 22.

The distance between the gate trench 21 and the contact trench 22 in the second direction is, for example, smaller than the width of the gate trench 21 in the second direction.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is located between the gate electrode 16 and the silicon carbide layer 10. The gate insulating layer 18 is provided between the source region 30 and the gate electrode 16, between the body region 28 and the gate electrode 16, and between the drift region 26 and the gate electrode 16.

The gate insulating layer 18 is, for example, a silicon oxide film. For example, a High-k insulating film (a high dielectric constant insulating film such as HfSiON, ZrSiON, or AlON) can be used to the gate insulating layer 18. In addition, for example, a stacked film of a silicon oxide film ($SiO_2$) and a High-k insulating film can be applied to the gate insulating layer 18.

The interlayer insulating layer 20 is provided on the gate electrode 16. The interlayer insulating layer 20 is provided between the gate electrode 16 and the source electrode 12.

For example, the thickness of the interlayer insulating layer 20 is larger than the thickness of the gate insulating layer 18. The interlayer insulating layer 20 is, for example, a silicon oxide film. The interlayer insulating layer 20 electrically separates the gate electrode 16 and the source electrode 12.

The interface (K0 in FIG. 3) between the source electrode 12 and the interlayer insulating layer 20 is closer to the second plane P2 than the first plane P1. The interface K0 between the source electrode 12 and the interlayer insulating layer 20 is located in the gate trench 21.

As illustrated in FIG. 2, on the first plane P1, the upper surface of the gate trench 21 is covered with the source electrode 12.

The source electrode 12 is located on side of the silicon carbide layer 10 closer to the first plane P1. The source electrode 12 is provided on the first plane P1 of the silicon carbide layer 10. The source electrode 12 is in contact with the source region 30 and the electric field relaxation region 32.

The source electrode 12 is in contact with the source region 30 on the first plane P1 of the silicon carbide layer 10 and on the side surface of the gate trench 21.

The contact region 12a that is a portion of the source electrode 12 is located in the contact trench 22. The contact region 12a is in contact with the source region 30 on the side surface of the contact trench 22. The contact region 12a is in contact with the electric field relaxation region 32 on the side and bottom surfaces of the contact trench 22.

The source electrode 12 contains a metal. The metal forming the source electrode 12 has, for example, a stacked structure of titanium (Ti) and aluminum (Al). The source electrode 12 may contain, for example, metal silicide or metal carbide in contact with the silicon carbide layer 10.

The drain electrode 14 is located on the side of the silicon carbide layer 10 closer to the second plane P2. The drain electrode 14 is provided on the second plane P2 of the silicon carbide layer 10. The drain electrode 14 is in contact with the drain region 24.

The drain electrode 14 is, for example, a metal or a metal semiconductor compound. The drain electrode 14 contains, for example, a material selected from the group consisting of nickel silicide (NiSi), titanium (Ti), nickel (Ni), silver (Ag), and gold (Au).

The $n^+$-type drain region 24 is provided on the side of the silicon carbide layer 10 closer to the second plane P2. The drain region 24 contains, for example, nitrogen (N) as an n-type impurity. The n-type impurity concentration of the drain region 24 is, for example, $1 \times 10^{18}$ cm$^{-3}$ or more and $1 \times 10^{21}$ cm$^{-3}$ or less.

The n$^-$-type drift region 26 is provided on the drain region 24. The drift region 26 is located between the first plane P1 and the drain region 24.

The drift region 26 contains, for example, nitrogen (N) as an n-type impurity. The n-type impurity concentration of the drift region 26 is lower than the n-type impurity concentration of the drain region 24. The n-type impurity concentration of the drift region 26 is, for example, $4 \times 10^{14}$ cm$^{-3}$ or more and $1 \times 10^{18}$ cm$^{-3}$ or less.

The p-type body region 28 is located between the drift region 26 and the first plane P1. The body region 28 is located between the gate trench 21 and the contact trench 22.

The body region 28 functions as a channel formation region of the MOSFET 100. For example, during the time of on-operation of the MOSFET 100, a channel through which electrons flow is formed in a region of the body region 28 in contact with the gate insulating layer 18. The region of the body region 28 in contact with the gate insulating layer 18 becomes a channel formation region.

The body region 28 contains, for example, aluminum (Al) as a p-type impurity. The p-type impurity concentration of the body region 28 is, for example, $5 \times 10^{16}$ cm$^{-3}$ or more and $5 \times 10^{17}$ cm$^{-3}$ or less.

The depth of the body region 28 is smaller than the depth of the gate trench 21. The depth of the body region 28 is, for example, 0.4 μm or more and 1.0 μm or less.

The n$^+$-type source region 30 is located between the body region 28 and the first plane P1. The source region 30 is located between the gate trench 21 and the contact trench 22.

The source region 30 is in contact with the source electrode 12. The source region 30 is in contact with the gate insulating layer 18.

The source region 30 contains, for example, phosphorus (P) as an n-type impurity. The source region 30 has an n-type impurity concentration higher than the drift region 26. The n-type impurity concentration of the source region 30 is, for example, $1 \times 10^{19}$ cm$^{-3}$ or more and $1 \times 10^{21}$ cm$^{-3}$ or less.

The depth of the source region 30 is smaller than the depth of the body region 28. The depth of the source region 30 is, for example, 0.3 μm or more and 0.6 μm or less.

A boundary between the body region 28 and the source region 30 is denoted by a first boundary (K1 in FIG. 3), a distance from the first plane P1 to the first boundary K1 is denoted by a first distance (d1 in FIG. 3), a boundary between the drift region 26 and the body region 28 is denoted by a second boundary (K2 in FIG. 3), and a distance from the first boundary K1 to the second boundary K2 is denoted by a second distance (d2 in FIG. 3).

The first distance d1 is substantially constant. That is, the depth of the source region 30 is substantially constant.

In addition, a constant distance or depth is a concept that differences caused by various manufacturing variations are allowed.

The first distance d1 (d1x in FIG. 3) along the gate insulating layer 18 is larger than the second distance d2 (d2x in FIG. 3) along the gate insulating layer 18. That is, in the region along the gate insulating layer 18, the depth of the source region 30 is larger than the length of the body region 28 in the third direction.

The first distance d1 is, for example, 1.2 times or more and twice or less of the second distance d2.

In addition, the distance from the first plane P1 to the second boundary K2 is denoted by a third distance (d3 in FIG. 3). The third distance d3 increases from the gate trench 21 toward the contact trench 22. That is, the depth of the body region 28 increases from the gate trench 21 toward the contact trench 22.

The p$^+$-type electric field relaxation region 32 is located between the contact trench 22 and the drift region 26. The electric field relaxation region 32 is in contact with the bottom surface of the contact trench 22. The electric field relaxation region 32 is in contact with the contact region 12a of the source electrode 12.

The electric field relaxation region 32 is located between the contact trench 22 and the body region 28. The electric field relaxation region 32 is in contact with the side surface of the contact trench 22.

The electric field relaxation region 32 has a function of relaxing the electric field applied to the gate insulating layer 18 at the time of off-operation of the MOSFET 100. The electric field relaxation region 32 is fixed at, for example, the same potential as the source electrode 12.

The electric field relaxation region 32 contains, for example, aluminum (Al) as a p-type impurity. The p-type impurity concentration of the electric field relaxation region 32 is higher than the p-type impurity concentration of the body region 28. The p-type impurity concentration of the electric field relaxation region 32 is, for example, ten times or more of the p-type impurity concentration of the body region 28. The p-type impurity concentration of the electric field relaxation region 32 is, for example, $5 \times 10^{17}$ cm$^{-3}$ or more and $5 \times 10^{20}$ cm$^{-3}$ or less.

Figure 4:
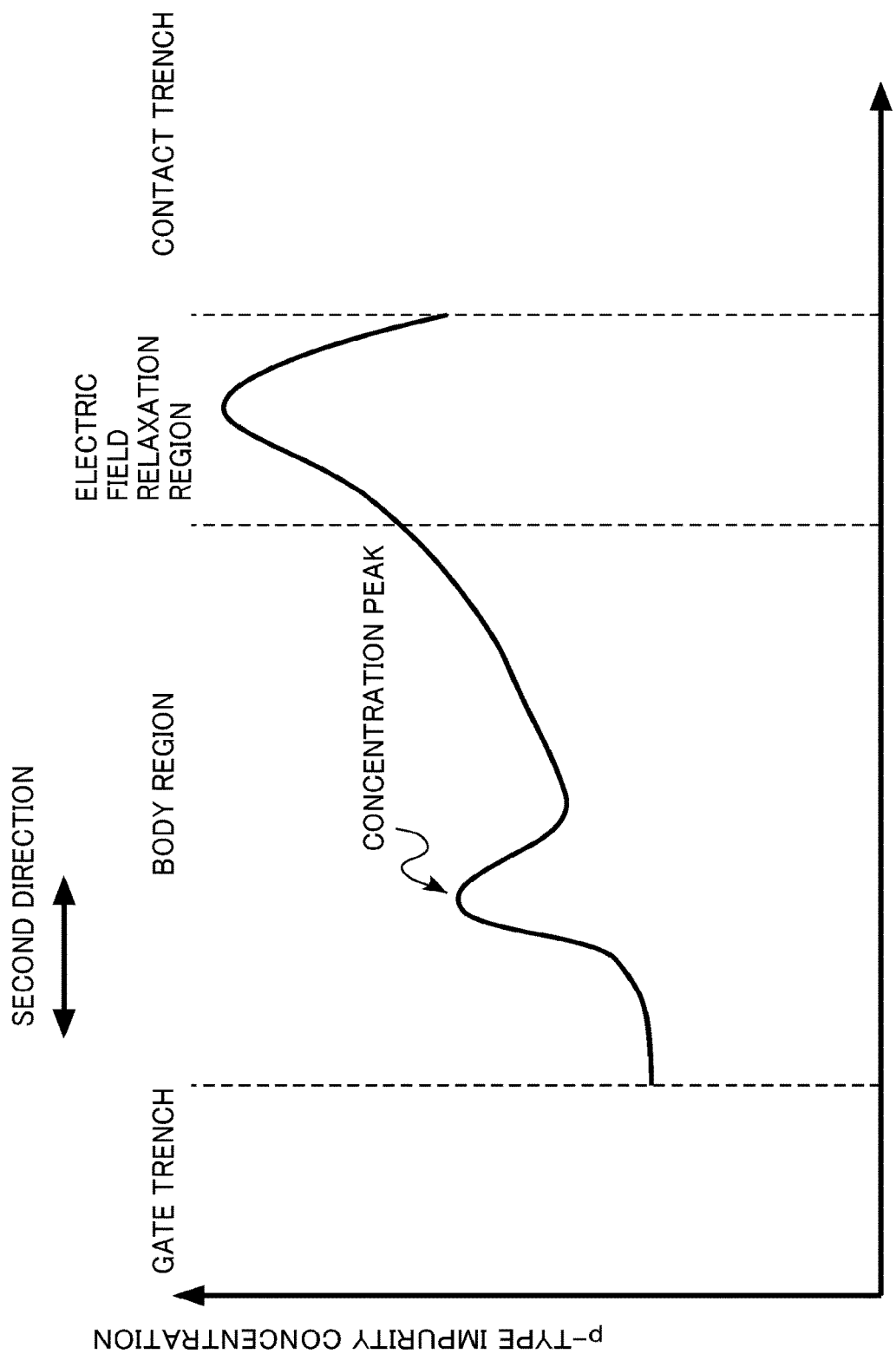
FIG. 4 is a view illustrating an impurity concentration distribution of the semiconductor device according to the first embodiment.

FIG. 4 is a view illustrating an impurity concentration distribution of the semiconductor device according to the first embodiment. FIG. 4 illustrates the concentration distribution of the p-type impurity in the body region 28 in the second direction.

The concentration distribution of the p-type impurity in the body region 28 in the second direction has a concentration peak between the gate trench 21 and the contact trench 22. In addition, another concentration peak also exists in the electric field relaxation region 32 between the gate trench 21 and the contact trench 22.

Next, an example of the method of manufacturing the semiconductor device according to the first embodiment will be described.

A method of manufacturing the semiconductor device according to the first embodiment includes: forming a first trench on a side of a first plane of a silicon carbide layer, the silicon carbide layer having the first plane, a second plane facing the first plane, and a first silicon carbide region of n-type located between the second plane and the first plane; forming a second trench on the side of the first plane of the silicon carbide layer; forming a second silicon carbide region of p-type by ion-implanting p-type impurities into the second trench in a direction inclined at a first angle with respect to a normal line of the first plane; forming a gate insulating layer in the first trench; forming a gate electrode on the gate insulating layer in the first trench; forming an insulating film on the gate electrode; etching the insulating film so that an upper surface of the insulating film in the first trench is lower than the first plane; and forming an electrode in the second trench and on the insulating film. The second silicon carbide region is in contact with a side surface of the first trench.

FIGS. 5, 6, 7, 8, 9, 10, 11, 12, 13, 14, 15, and 16 are schematic cross-sectional views illustrating an example of the method of manufacturing the semiconductor device according to the first embodiment. FIGS. 5, 6, 7, 8, 9, 10, 11, 12, 13, 14, 15, and 16 illustrate cross-sections corresponding to FIG. 1.

Figure 5:
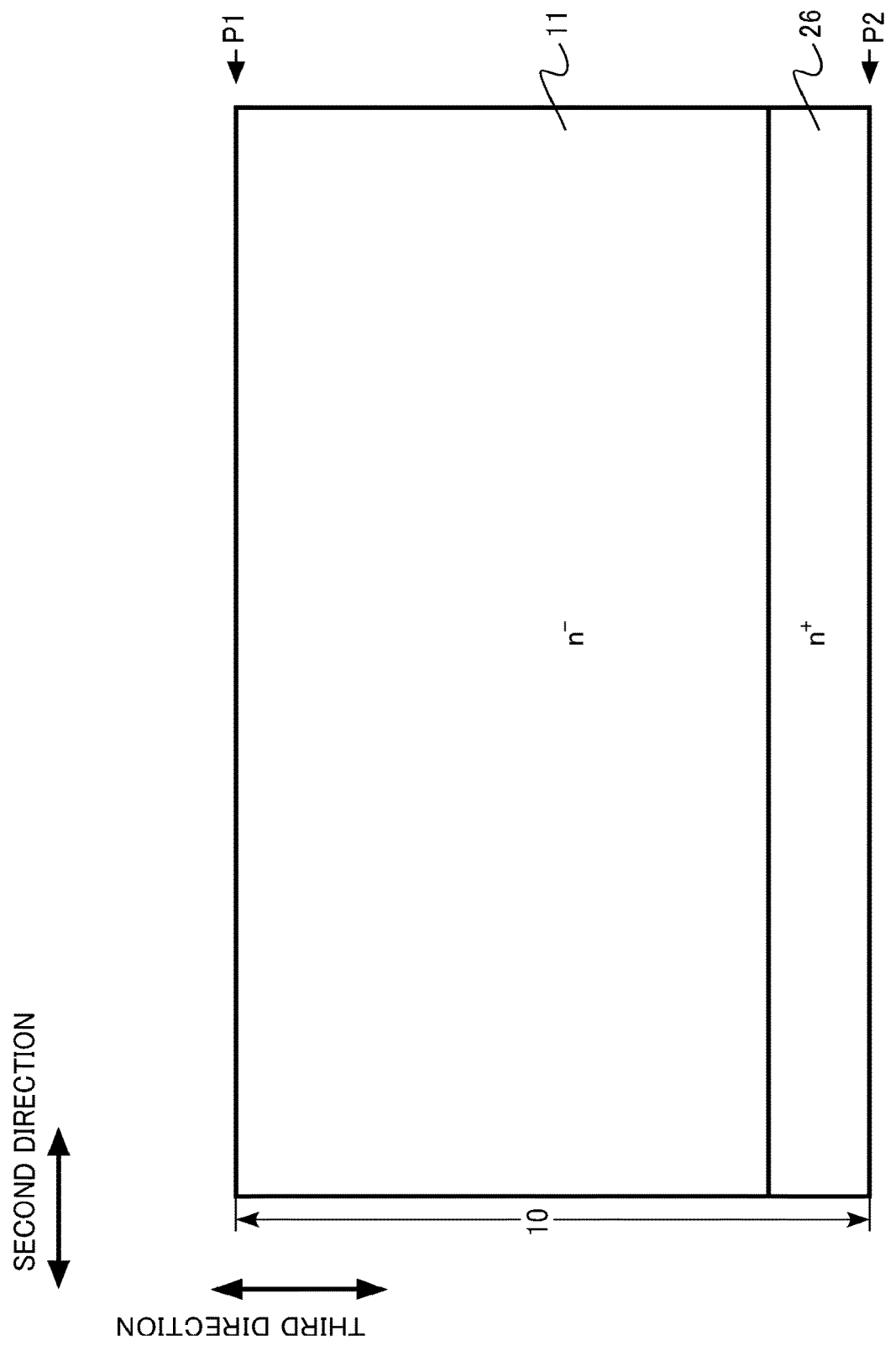
FIG. 5 is a schematic cross-sectional view illustrating an example of a method of manufacturing the semiconductor device according to the first embodiment.

First, a silicon carbide layer 10 having an n+-type drain region 24 and an n−-type epitaxial layer 11 formed on the drain region 24 by epitaxial growth is prepared (FIG. 5). A portion of the epitaxial layer 11 eventually becomes the drift region 26.

The silicon carbide layer 10 has a first plane ("P1" in FIG. 5) and a second plane ("P2" in FIG. 5). Hereinafter, the first plane P1 is also referred to as a front surface, and the second plane P2 is also referred to as a back surface.

Figure 6:
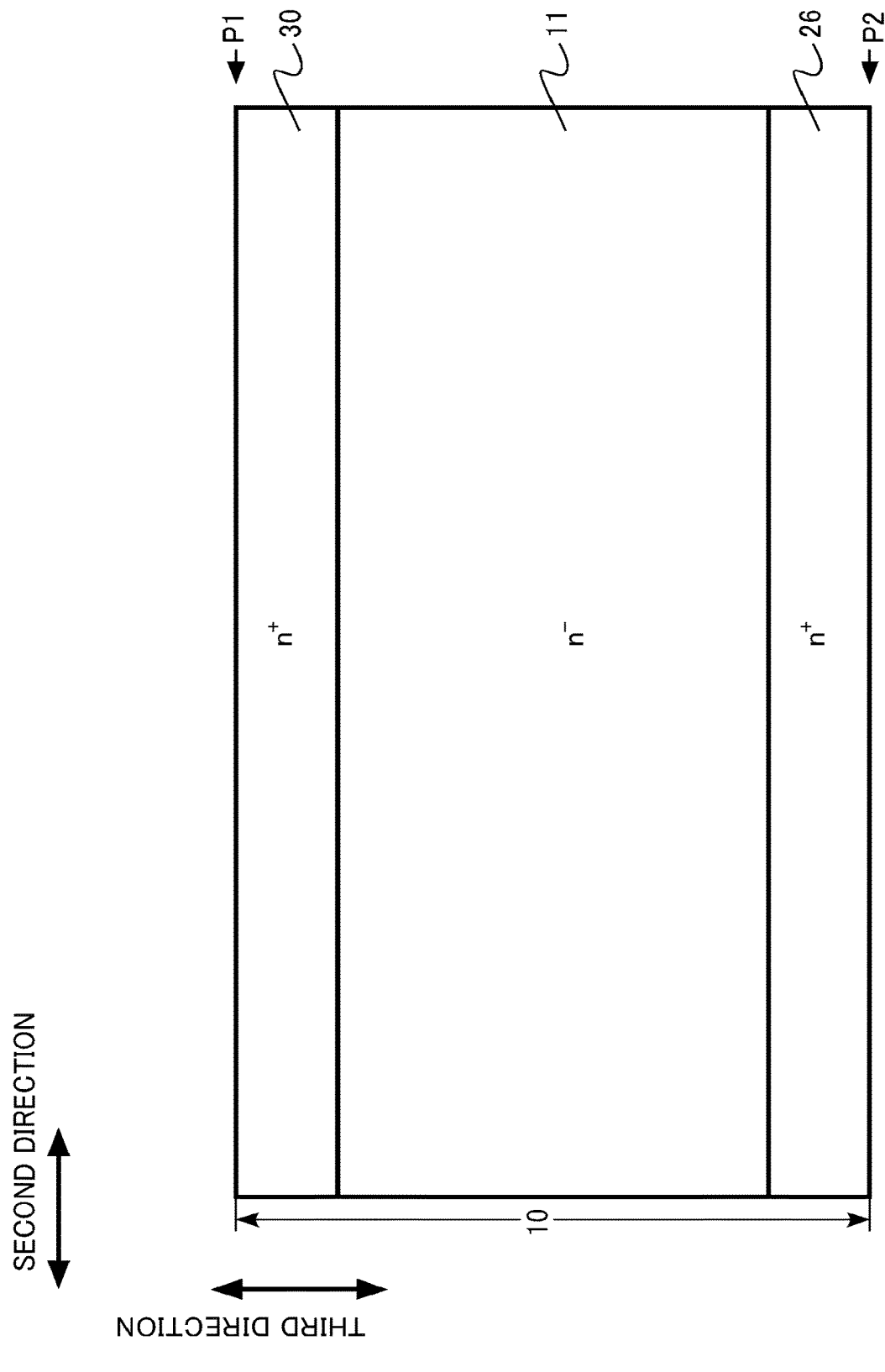
FIG. 6 is a schematic cross-sectional view illustrating an example of the method of manufacturing the semiconductor device according to the first embodiment.

Next, an n+-type source region 30 is formed in the epitaxial layer 11 by an ion implantation method (FIG. 6).

Next, a mask material 50 is formed on the front surface of the silicon carbide layer 10. The mask material 50 is formed, for example, by depositing a film by a chemical vapor deposition method (CVD method) and patterning the film by using a lithography method and a reactive ion etching method (RIE method). The mask material 50 is, for example, a silicon oxide film.

Figure 7:
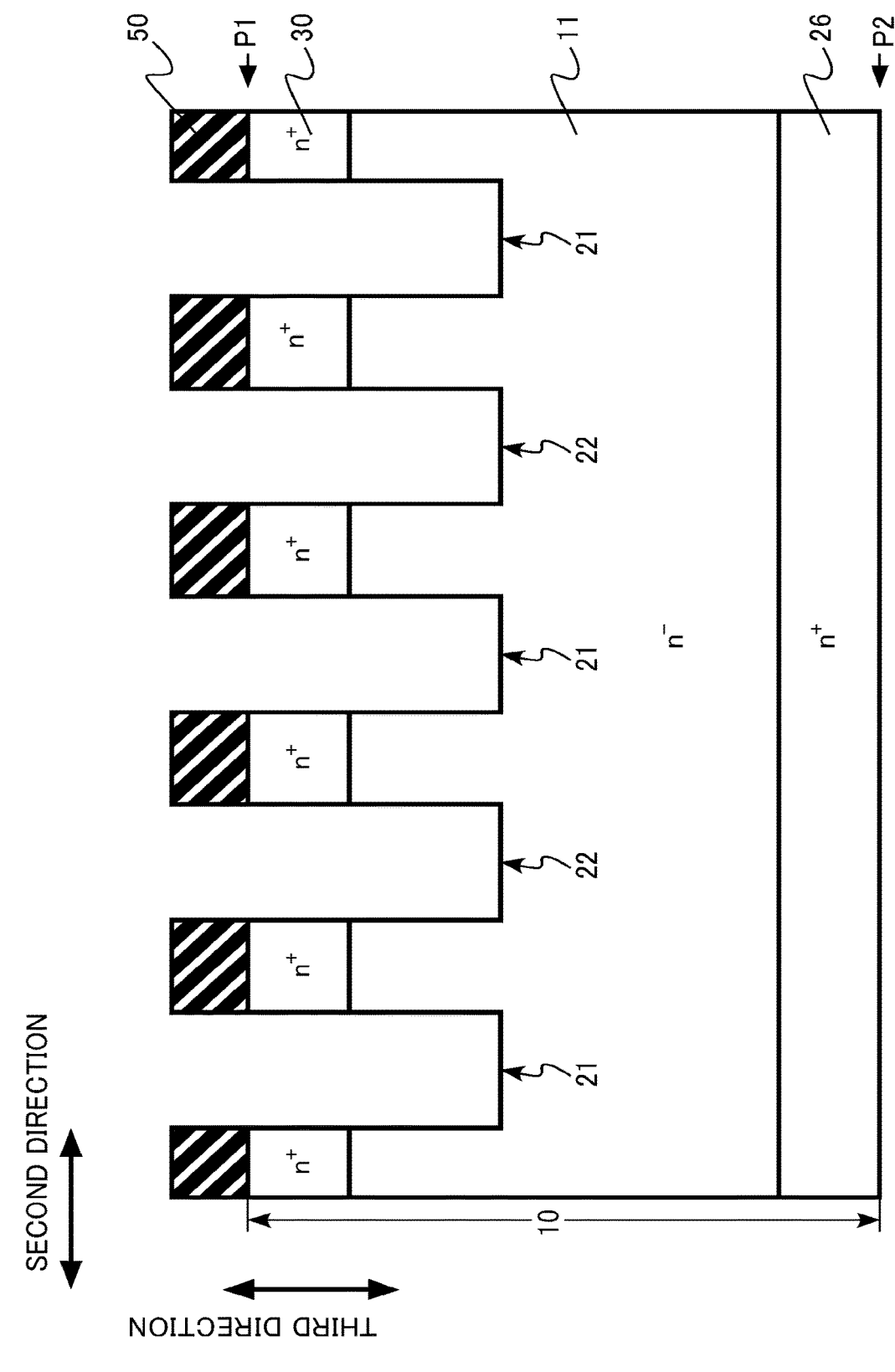
FIG. 7 is a schematic cross-sectional view illustrating an example of the method of manufacturing the semiconductor device according to the first embodiment.

Next, a gate trench 21 (first trench) and a contact trench 22 (second trench) are formed by using the mask material 50 as a mask (FIG. 7). The gate trench 21 and the contact trench 22 are formed by using an RIE method. The gate trench 21 and the contact trench 22 are formed so as to penetrate the source region 30.

Next, the mask material 50 is peeled off. The mask material 50 is peeled off by, for example, a wet etching method. Next, the mask material 52 is formed on the front surface of the silicon carbide layer 10. The mask material 52 covers the gate trench 21. The mask material 52 is, for example, a photoresist.

Figure 8:
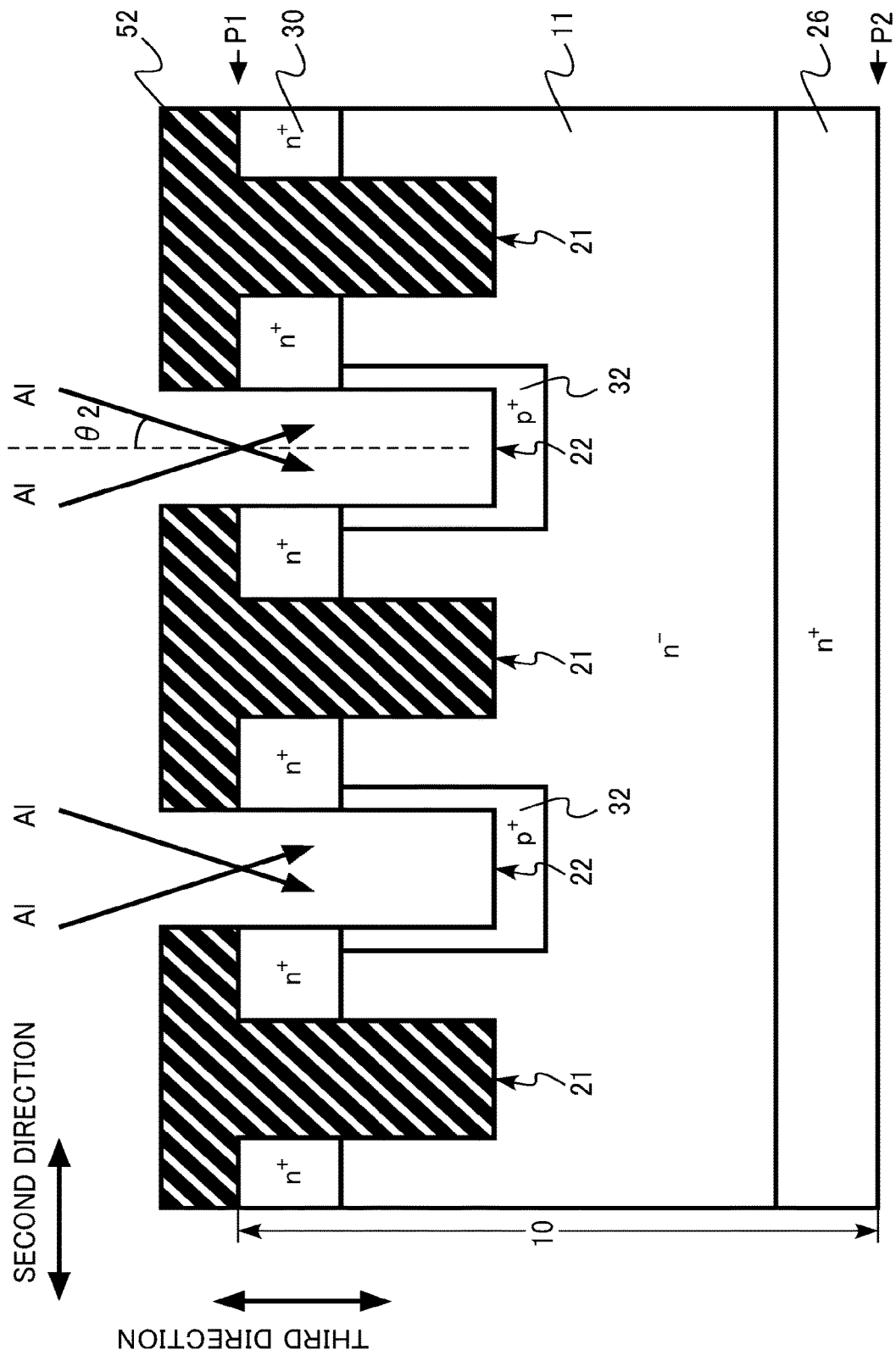
FIG. 8 is a schematic cross-sectional view illustrating an example of the method of manufacturing the semiconductor device according to the first embodiment.

Next, a p+-type electric field relaxation region 32 is formed (FIG. 8). The electric field relaxation region 32 is formed by implanting aluminum ions into the contact trench 22 by oblique ion implantation method by using the mask material 52 as a mask (FIG. 8). Aluminum ions are implanted with p-type impurities in a direction inclined at a second angle ($\theta 2$ in FIG. 8) with respect to a normal line (dotted line in FIG. 8) of the first plane P1. The p+-type electric field relaxation region 32 is formed near the side and bottom surfaces of the contact trench 22 in the silicon carbide layer 10.

Figure 9:
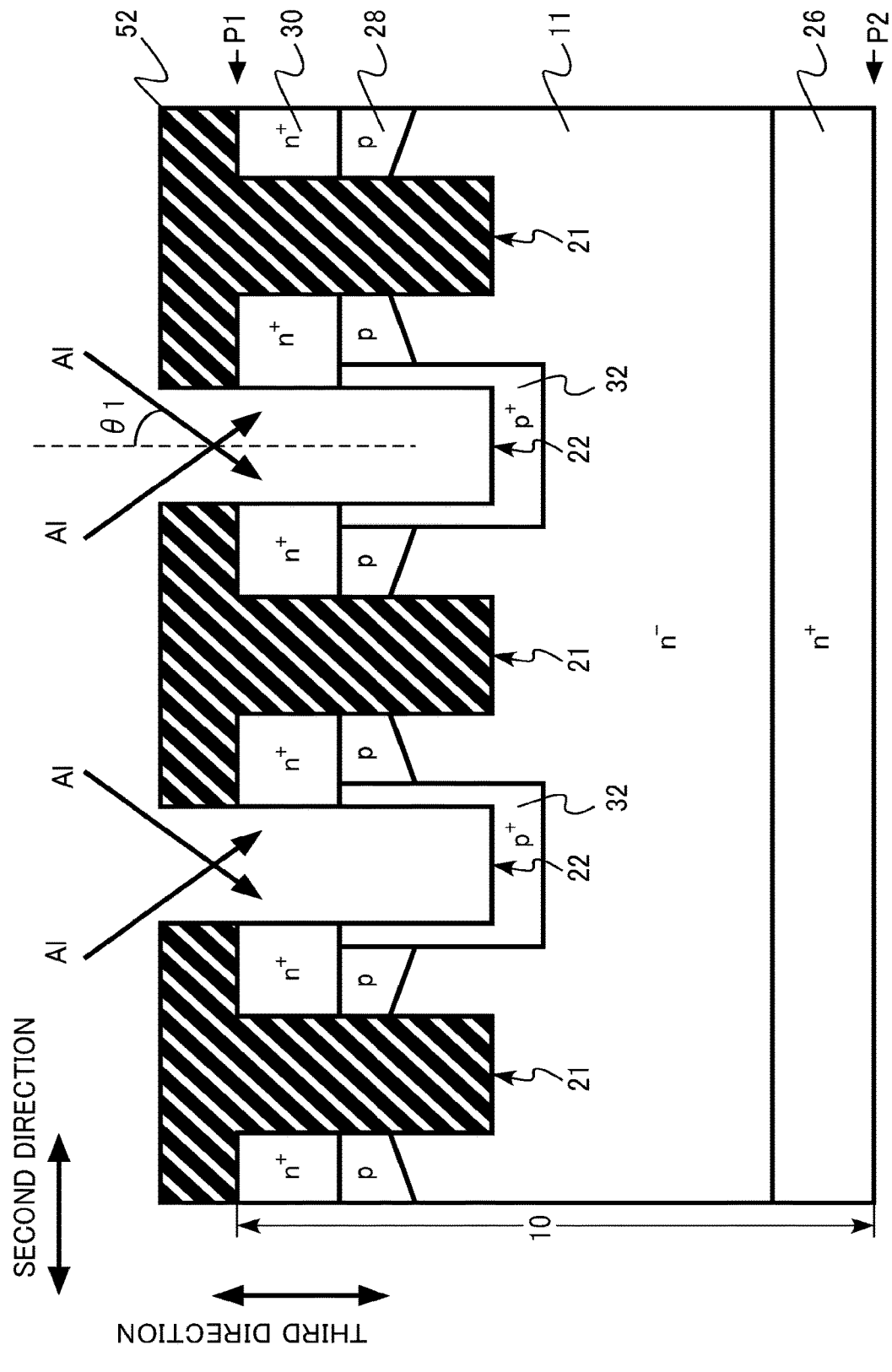
FIG. 9 is a schematic cross-sectional view illustrating an example of the method of manufacturing the semiconductor device according to the first embodiment.

Next, a p-type body region 28 is formed (FIG. 9). The body region 28 is formed by implanting aluminum ions into the contact trench 22 by oblique ion implantation method by using the mask material 52 as a mask. Aluminum ions are implanted with p-type impurities in a direction inclined at a first angle ($\theta 1$ in FIG. 8) with respect to a normal line (dotted line in FIG. 9) of the first plane P1.

The first angle $\theta 1$ is larger than the second angle $\theta 2$. In other words, the second angle $\theta 2$ is smaller than the first angle $\theta 1$.

The p-type body region 28 is formed on the side surface of the gate trench 21 of the silicon carbide layer 10. The body region 28 is formed to be in contact with the side surface of the gate trench 21.

A portion of the p-type impurities ion-implanted into the contact trench 22 is implanted into the side surface of the contact trench 22 after losing kinetic energy due to passing through the mask material 52. For this reason, the depth of the body region 28 increases from the gate trench 21 toward the contact trench 22.

Figure 10:
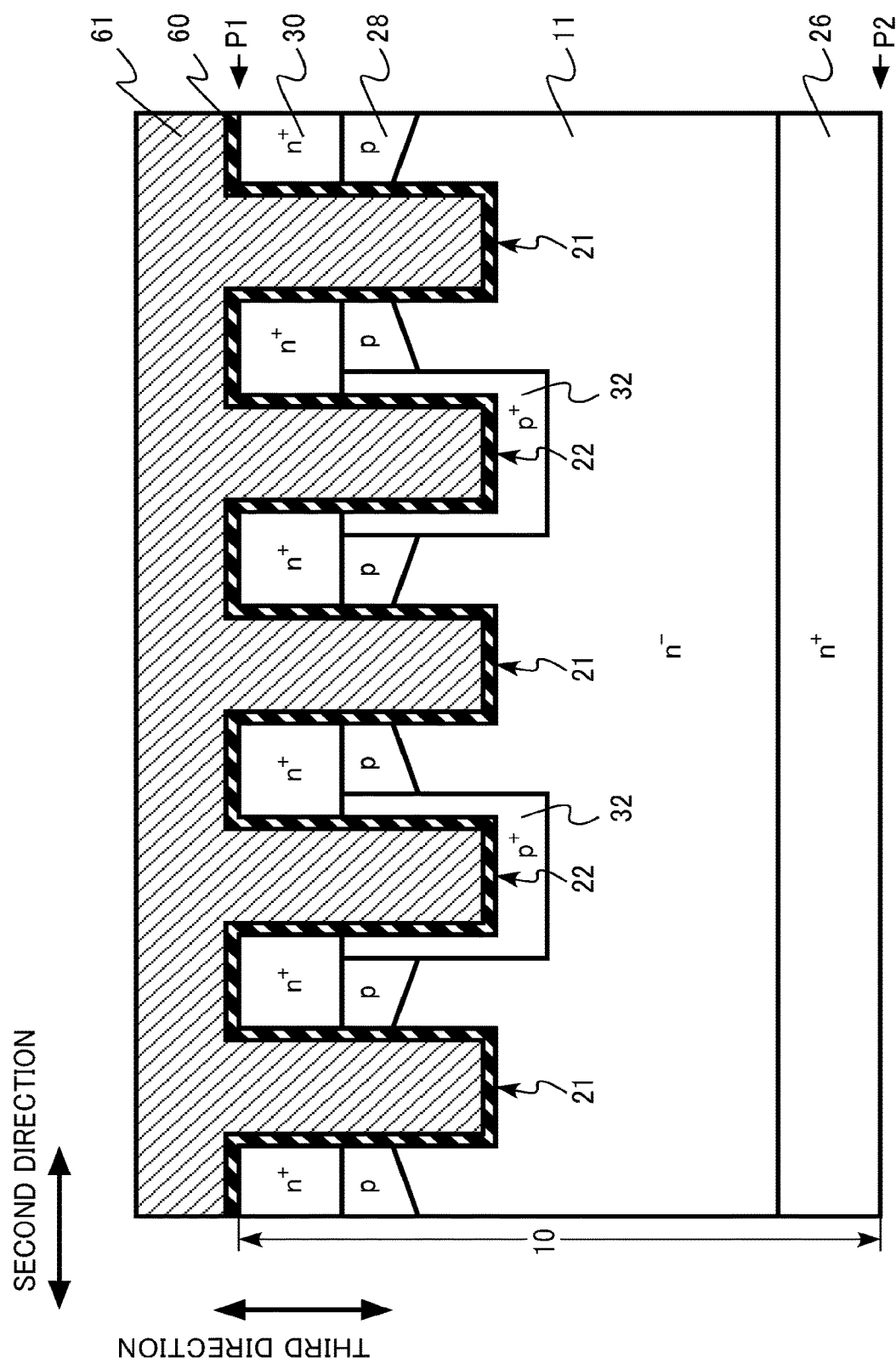
FIG. 10 is a schematic cross-sectional view illustrating an example of the method of manufacturing the semiconductor device according to the first embodiment.

Next, the mask material 52 is peeled off. Next, a first silicon oxide film 60 and a polycrystalline silicon film 61 are formed in the gate trench 21 and the contact trench 22 (FIG. 10).

The first silicon oxide film 60 and the polycrystalline silicon film 61 are formed by, for example, a CVD method.

A portion of the first silicon oxide film 60 becomes the gate insulating layer 18. A portion of the polycrystalline silicon film 61 becomes the gate electrode 16.

Figure 11:
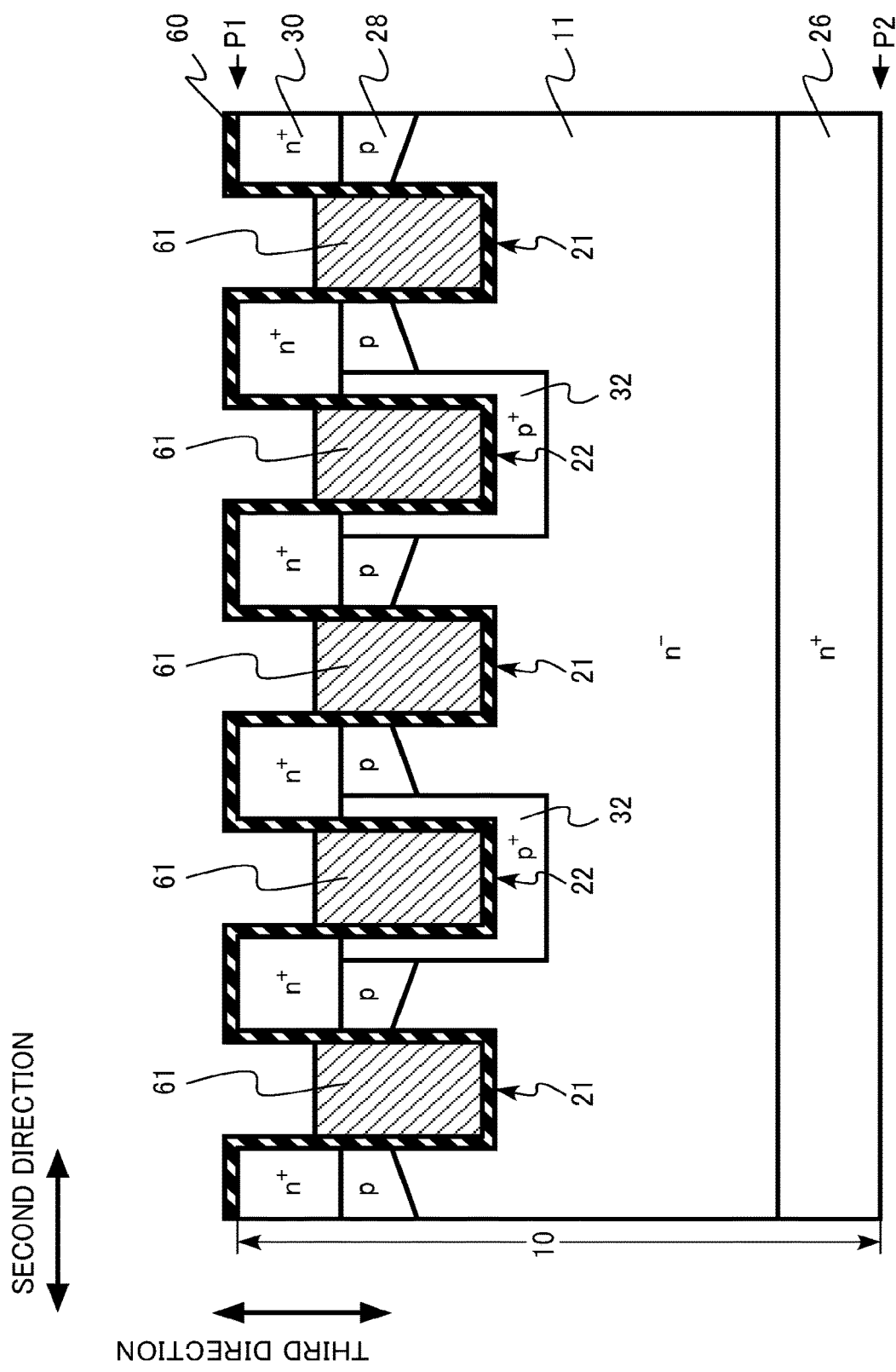
FIG. 11 is a schematic cross-sectional view illustrating an example of the method of manufacturing the semiconductor device according to the first embodiment.

Next, the polycrystalline silicon film 61 on the front surface of the silicon carbide layer 10 is removed (FIG. 11). The polycrystalline silicon film 61 on the front surface of the silicon carbide layer 10 is removed by, for example, a dry etching method. A portion of the polycrystalline silicon film 61 remains in the gate trench 21 and the contact trench 22.

Next, a mask material 54 is formed on the front surface of the silicon carbide layer 10. The mask material 54 is, for example, a photoresist.

The mask material 54 covers the gate trench 21. The mask material 54 covers the polycrystalline silicon film 61 in the gate trench 21.

Figure 12:
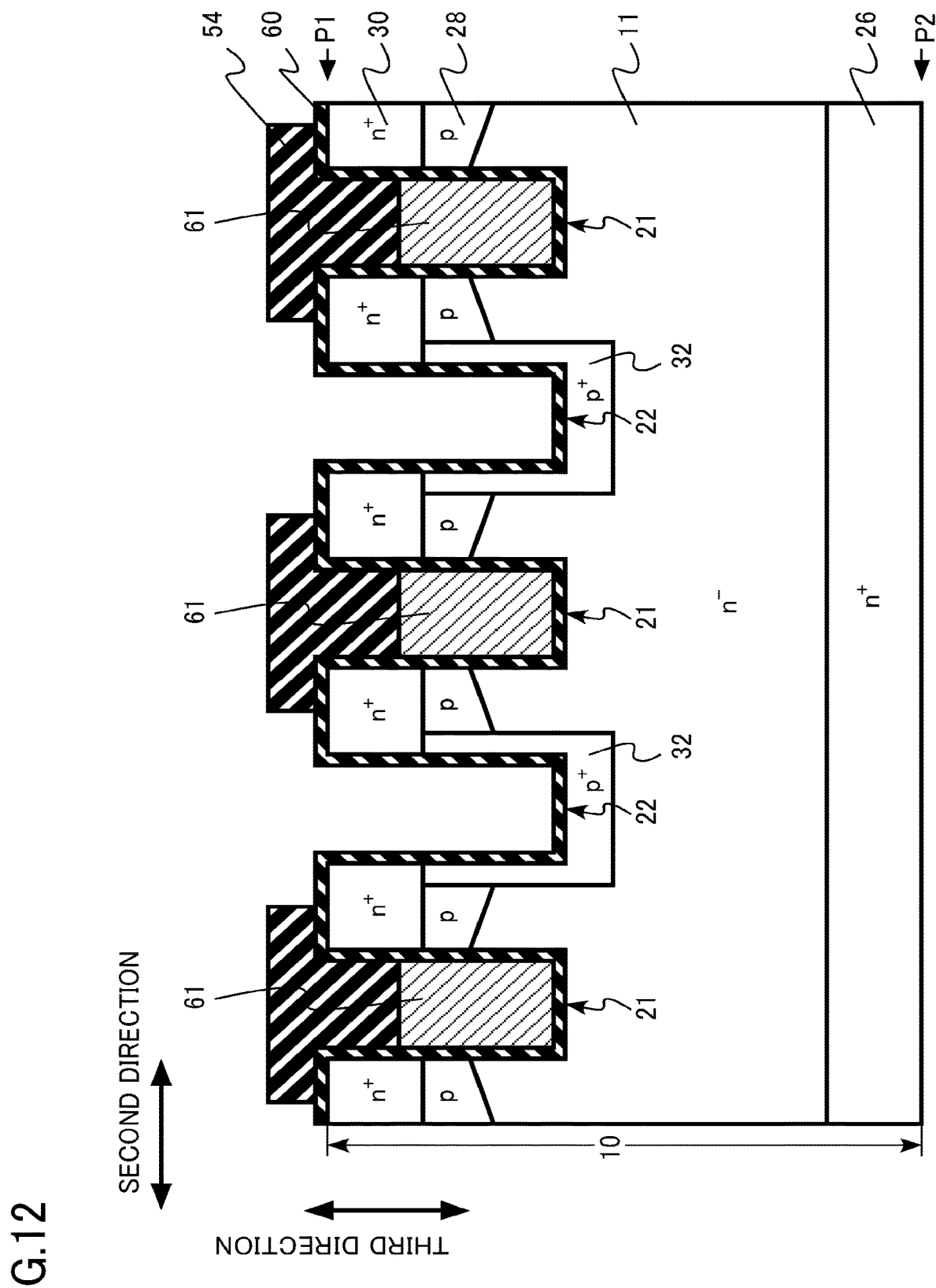
FIG. 12 is a schematic cross-sectional view illustrating an example of the method of manufacturing the semiconductor device according to the first embodiment.

Next, the polycrystalline silicon film 61 in the contact trench 22 is removed by using the mask material 54 as a mask (FIG. 12). The polycrystalline silicon film 61 is removed by, for example, a dry etching method.

Figure 13:
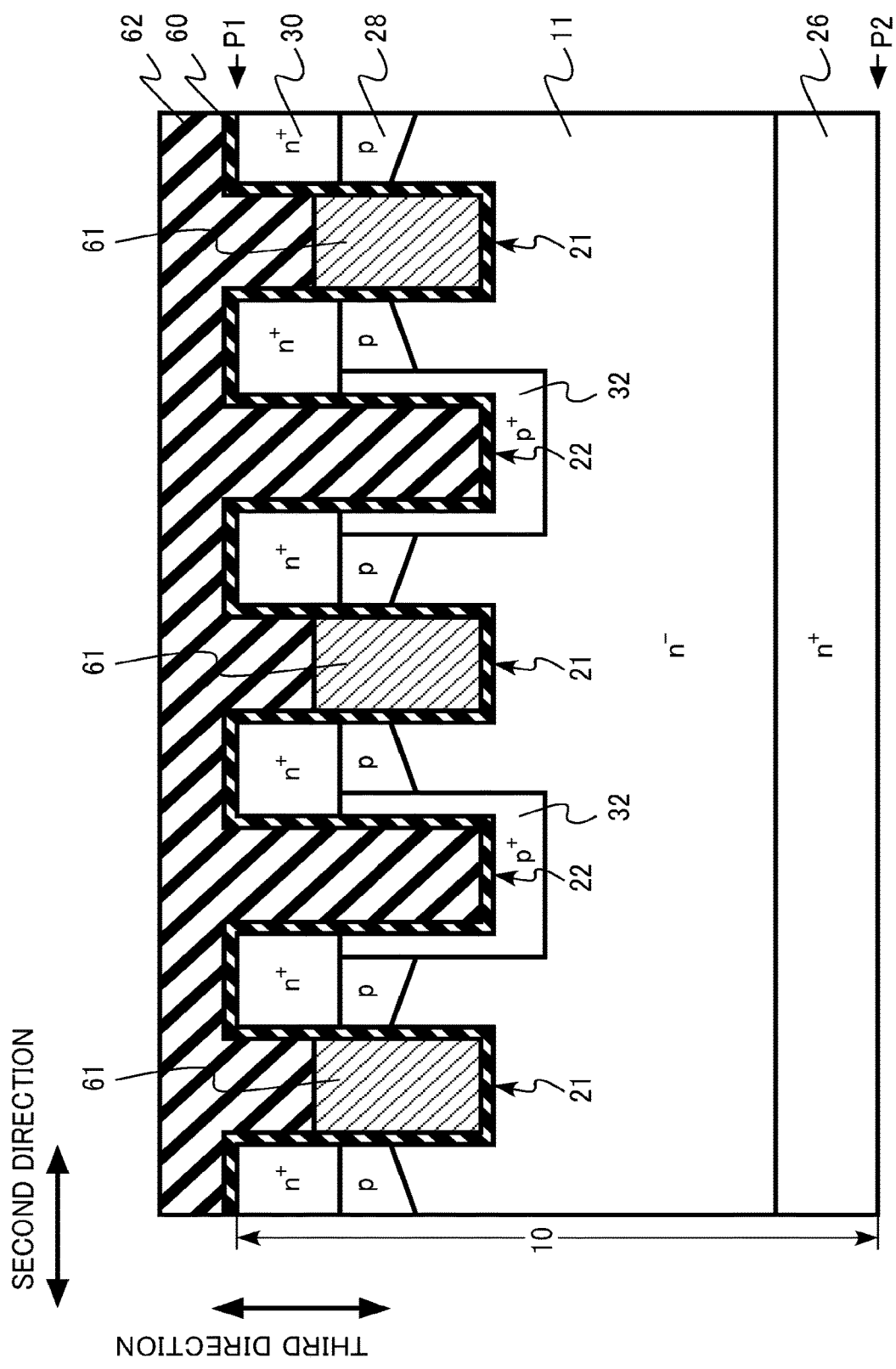
FIG. 13 is a schematic cross-sectional view illustrating an example of the method of manufacturing the semiconductor device according to the first embodiment.

Next, the mask material 54 is removed. Next, a second silicon oxide film 62 (an insulating film) is formed on the first silicon oxide film 60 and the polycrystalline silicon film 61 (FIG. 13). The second silicon oxide film 62 is formed by, for example, a CVD method. A portion of the second silicon oxide film 62 becomes the interlayer insulating layer 20.

Figure 14:
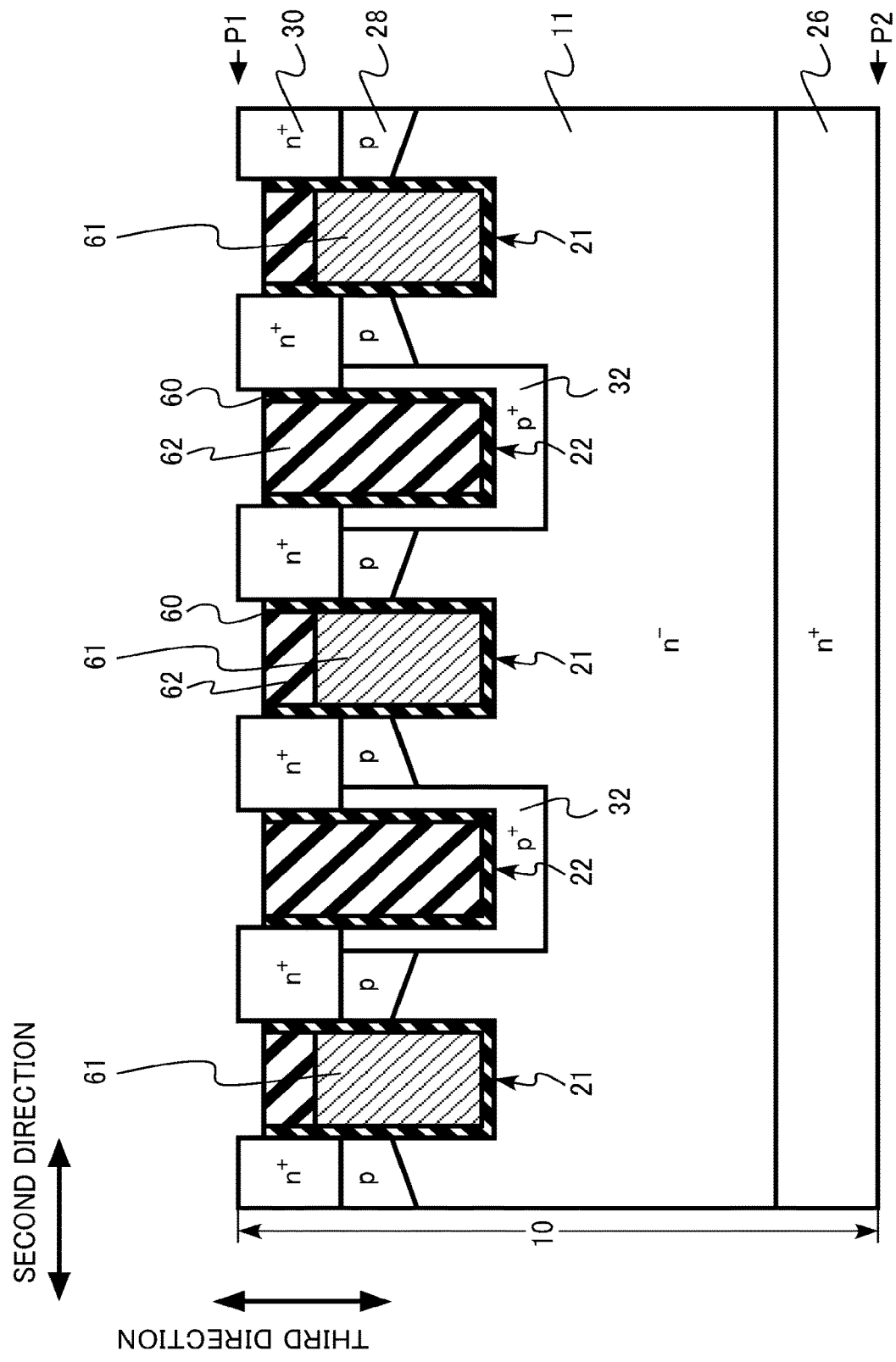
FIG. 14 is a schematic cross-sectional view illustrating an example of the method of manufacturing the semiconductor device according to the first embodiment.

Next, the first silicon oxide film 60 and the second silicon oxide film 62 on the front surface of the silicon carbide layer 10 are removed (FIG. 14). The first silicon oxide film 60 and the second silicon oxide film 62 are removed by, for example, a wet etching method. The upper surface of the second silicon oxide film 62 becomes lower than the first plane.

Next, a mask material 56 is formed on the front surface of the silicon carbide layer 10. The mask material 56 covers the gate trench 21. The mask material 56 is, for example, a photoresist.

Figure 15:
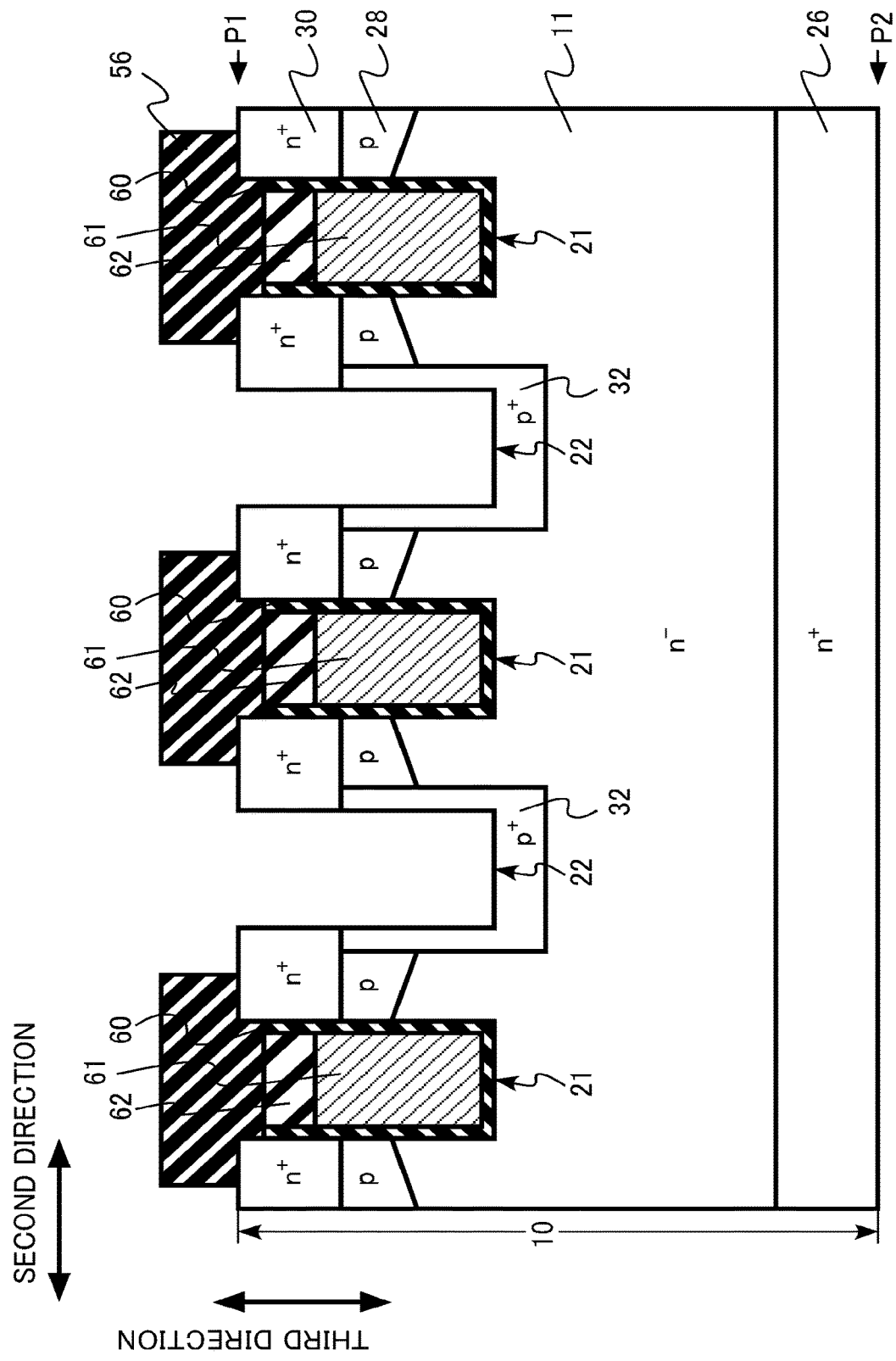
FIG. 15 is a schematic cross-sectional view illustrating an example of the method of manufacturing the semiconductor device according to the first embodiment.

Next, the first silicon oxide film 60 and the second silicon oxide film 62 in the contact trench 22 are removed by using the mask material 56 as a mask (FIG. 15). The first silicon oxide film 60 and the second silicon oxide film 62 are removed by, for example, a wet etching method.

Figure 16:
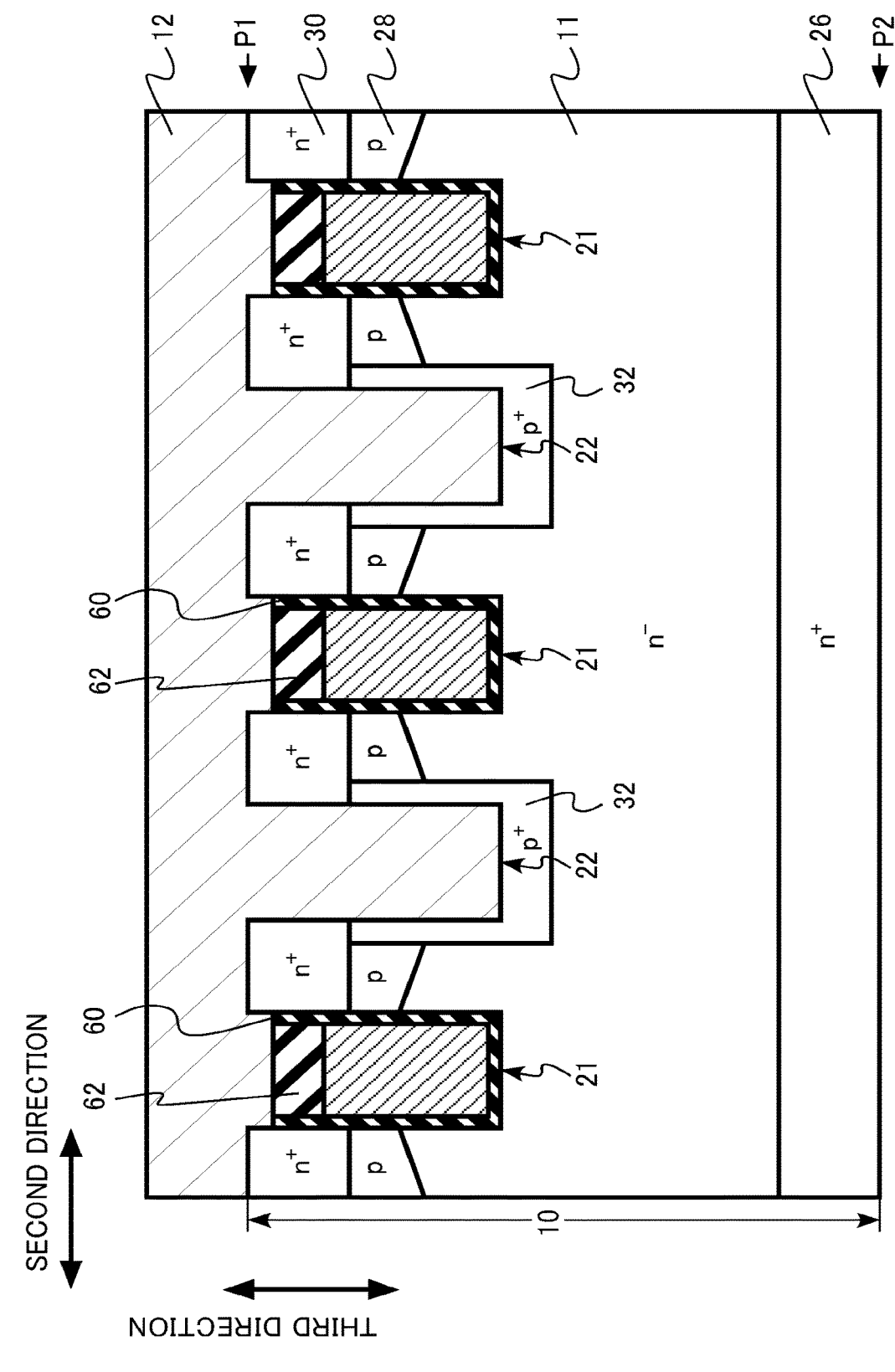
FIG. 16 is a schematic cross-sectional view illustrating an example of the method of manufacturing the semiconductor device according to the first embodiment.

Next, the mask material 56 is removed. Next, a source electrode 12 is formed in the contact trench 22 and on the second silicon oxide film 62 (FIG. 16). The source electrode 12 is formed, for example, by depositing a metal film by a CVD method.

After that, the drain electrode 14 is formed on the back surface of the silicon carbide layer 10 by using a known process technique. By the above manufacturing method, the MOSFET 100 illustrated in FIGS. 1 to 3 is manufactured.

Next, the functions and effects of the semiconductor device according to the first embodiment and the method of manufacturing the semiconductor device will be described.

A trench gate structure in which the gate electrode 16 is provided in the gate trench 21 is applied to the MOSFET 100. By applying the trench gate structure, the channel area per unit area increased, and the on-resistance of the MOSFET 100 is reduced.

In addition, in the MOSFET 100, a contact region 12a that is a portion of the source electrode 12 is provided in the contact trench 22. The MOSFET 100 is a MOSFET having a so-called double trench structure.

By providing the contact region 12a in the contact trench 22, electrical connection to the body region 28 and the source region 30 can be acquired on the side surface of the contact trench 22. Therefore, the contact area of the source electrode 12 on the front surface of the silicon carbide layer 10 can be reduced. Therefore, the channel area per unit area increases, and the on-resistance of the MOSFET 100 decreases.

The MOSFET 100 includes the electric field relaxation region 32 around the bottom and side surfaces of the contact trench 22. Therefore, during the time of off-operation of the MOSFET 100, the electric field applied to the gate insulating layer 18 is relaxed. Therefore, the reliability of the gate insulating layer 18 is improved.

In addition, in the MOSFET 100, the interface K0 between the source electrode 12 and the interlayer insulating layer 20 is located in the gate trench 21. In other words, the interlayer insulating layer 20 is buried in the gate trench 21 and, thus, does not exist on the front surface of the silicon carbide layer 10.

With the above structure, the distance between the gate trench 21 and the contact trench 22 can be reduced. Therefore, the channel area per unit area further increases, and the on-resistance of the MOSFET 100 is further reduced.

Figure 17:
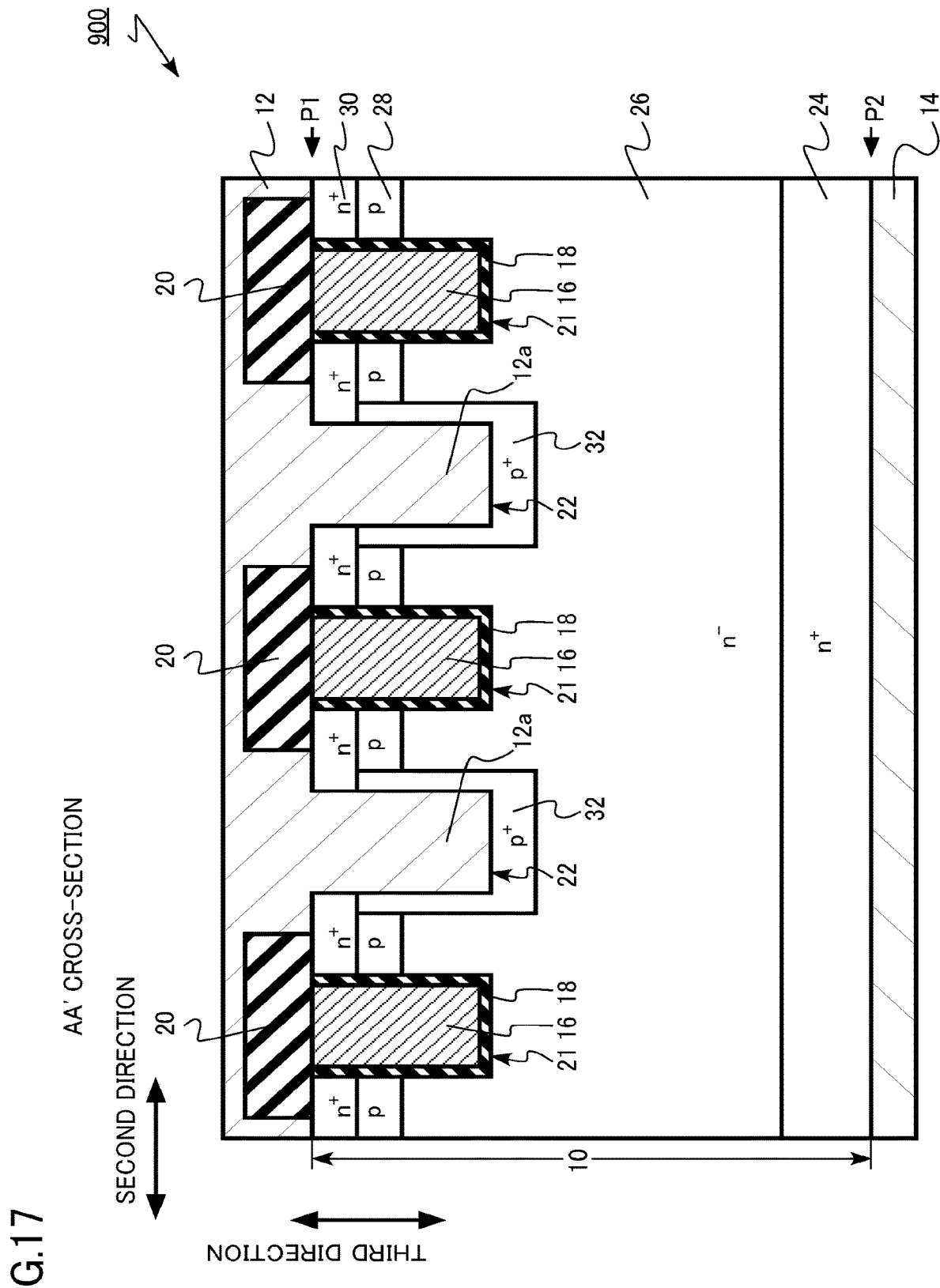
FIG. 17 is a schematic cross-sectional view of a semiconductor device according to Comparative Example.

FIG. 17 is a schematic cross-sectional view of a semiconductor device according to Comparative Example. The semiconductor device according to Comparative Example is a MOSFET 900 having a double trench structure.

The MOSFET 900 according to Comparative Example is different from the MOSFET 100 according to the first embodiment in that the interlayer insulating layer 20 exists on the front surface of the silicon carbide layer 10 and the interlayer insulating layer 20 is patterned on the front surface of the silicon carbide layer 10.

In forming the interlayer insulating layer 20 of the MOSFET 900, an end of the interlayer insulating layer 20 is formed on the front surface of the silicon carbide layer 10. The position of the end of the interlayer insulating layer 20 is defined by the position of the resist end in the lithography process at the time of patterning the interlayer insulating layer 20.

The distance between the end of the interlayer insulating layer 20 and the gate trench 21 or the distance between the end of the interlayer insulating layer 20 and the contact trench 22 needs to be determined in consideration of the amount of misalignment in the lithography process.

Therefore, the amount of misalignment in the lithography process becomes a constraint in reducing the distance between the gate trench 21 and the contact trench 22. Therefore, it is difficult to reduce the distance between the gate trench 21 and the contact trench 22.

In the MOSFET 100 according to the first embodiment, the interlayer insulating layer 20 is buried in the gate trench 21. Therefore, as illustrated in FIGS. 13 and 14, the interlayer insulating layer 20 can be processed without using the lithography process. The interlayer insulating layer 20 can be formed in a self-aligned manner with the gate trench 21 and the contact trench 22.

Therefore, the distance between the gate trench 21 and the contact trench 22 is determined without considering the amount of misalignment in the lithography process. Therefore, the distance between the gate trench 21 and the contact trench 22 can be easily reduced.

In addition, in the MOSFET 100, as illustrated in FIG. 3, in the region along the gate insulating layer 18, the depth of the source region 30 is larger than the length of the body region 28 in the third direction. In addition, the depth of the source region 30 is constant. The region of the body region 28 along the gate insulating layer 18 becomes a channel formation region of the MOSFET 100.

Therefore, the parasitic resistance between the channel formation region of the MOSFET 100 and the contact region 12a in contact trench 22 is small. Therefore, the on-resistance of the MOSFET 100 is further reduced.

In addition, in the MOSFET 100, the source electrode 12 is in contact with the source region 30 even on the side surface of the gate trench 21 by burying the interlayer insulating layer 20 in the gate trench 21. Therefore, the source electrode 12 is close to the channel formation region. Therefore, the parasitic resistance between the channel formation region of the MOSFET 100 and the source electrode 12 is small. Therefore, the on-resistance of the MOSFET 100 is further reduced.

In addition, in the body region 28 of the MOSFET 100, as illustrated in FIG. 4, the concentration distribution of the p-type impurity in the second direction has a concentration peak between the gate trench 21 and the contact trench 22. In other words, a region having a high p-type impurity concentration is provided in a region of the body region 28 that is away from the channel formation region in contact with the gate insulating layer 18 in the second direction. By providing a region having a high p-type impurity concentration, the short channel effect of the MOSFET 100 can be suppressed. Therefore, it is possible to realize reduction of the on-resistance by shortening the channel length of the MOSFET 100.

By reducing the p-type impurity concentration of the concentration peak on the contact trench 22 side, it is possible to suppress the occurrence of crystal defects in the body region 28.

The concentration distribution of the p-type impurity in the body region 28 as illustrated in FIG. 4 can be realized by forming the body region 28 by oblique ion implantation from the side surface of the contact trench 22 as illustrated in FIG. 9.

In addition, by forming the body region 28 by oblique ion implantation from the side surface of the contact trench 22, for example, the deep body region 28 can be formed without using a high-energy ion implantation method with high process cost.

From the viewpoint of forming the body region 28 so as to reach the side surface of the gate trench 21 by using oblique ion implantation from the side surface of the contact trench 22, it is preferable that the distance between the gate trench 21 and the contact trench 22 in the second direction is small. As described above, in the MOSFET 100, the distance between the gate trench 21 and the contact trench 22 in the second direction can be reduced by burying the interlayer insulating layer 20 in the gate trench 21. It is preferable that the distance between the gate trench 21 and the contact trench 22 in the second direction is smaller than the width of the gate trench 21 in the second direction.

In addition, in the MOSFET 100, the depth of the body region 28 increases from the gate trench 21 toward the contact trench 22. With this structure, it is possible to simultaneously achieve reduction of the on-resistance by shortening the channel length of the MOSFET 100 and relaxation of the electric field applied to the gate insulating layer 18.

As described above, according to the first embodiment, it is possible to realize a MOSFET capable of reducing the on-resistance.

Second Embodiment

A method of manufacturing a semiconductor device according to a second embodiment is different from the method of manufacturing the semiconductor device according to the first embodiment in that the first trench is formed after forming the second silicon carbide region. Hereinafter, a portion of contents overlapping with the semiconductor device according to the first embodiment may be omitted in description.

Hereinafter, an example of the method of manufacturing the semiconductor device according to the second embodiment will be described. The method of manufacturing a semiconductor device according to the second embodiment is the method of manufacturing the MOSFET 100 according to the first embodiment.

FIGS. 18, 19, 20, and 21 are schematic cross-sectional views illustrating an example of the method of manufacturing the semiconductor device according to the second embodiment. FIGS. 18, 19, 20, and 21 illustrate cross sections corresponding to FIG. 1.

The processes up to the formation of the $n^+$-type source region 30 are the same as those in the method of manufacturing the semiconductor device according to the first embodiment.

Next, a mask material 51 is formed on the front surface of the silicon carbide layer 10. The mask material 51 is, for example, a silicon oxide film.

Figure 18:
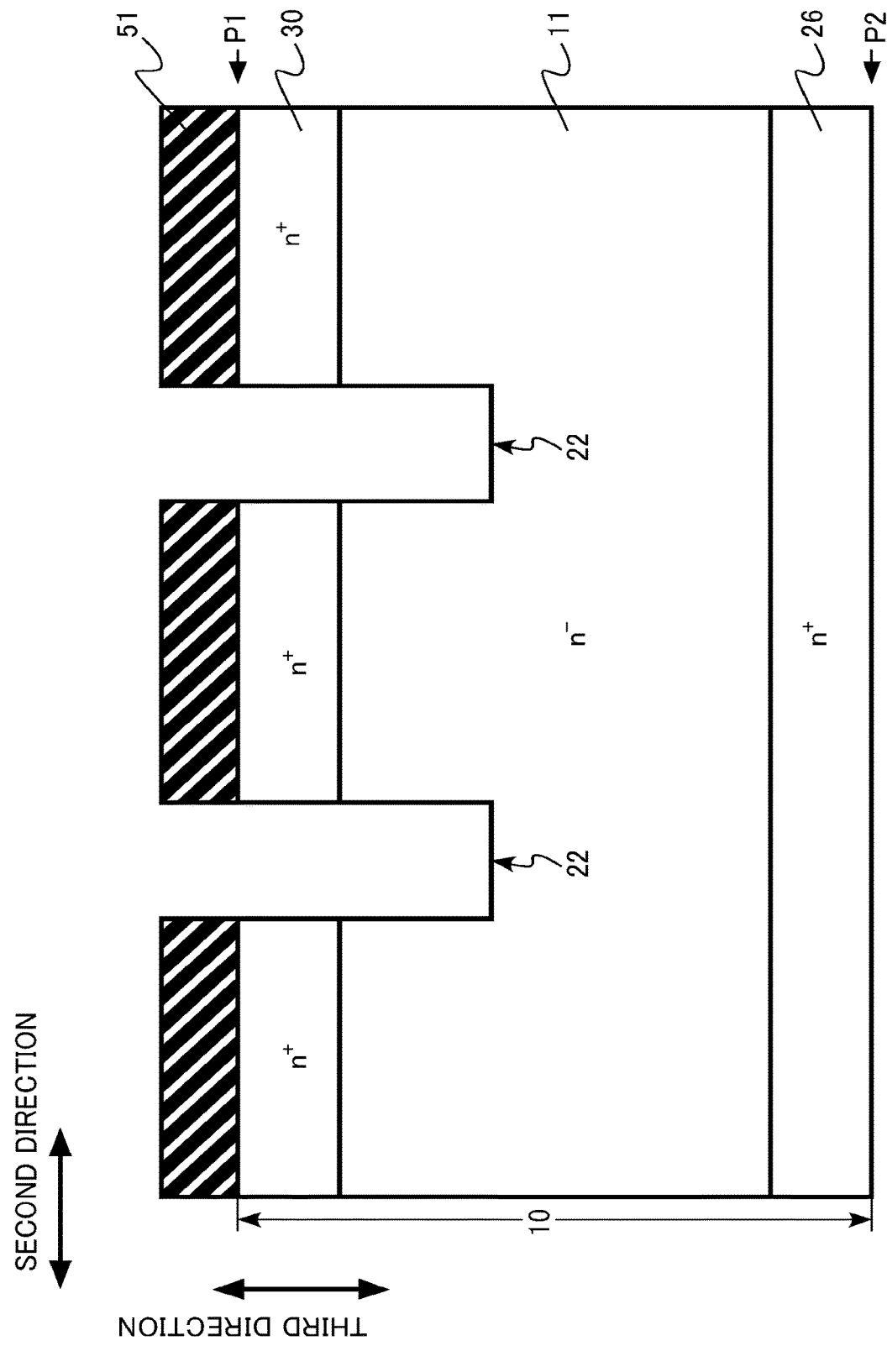
FIG. 18 is a schematic cross-sectional view illustrating an example of a method of manufacturing the semiconductor device according to a second embodiment.

Next, a contact trench 22 (second trench) is formed by using the mask material 51 as a mask (FIG. 18). The contact trench 22 is formed so as to penetrate the source region 30.

Figure 19:
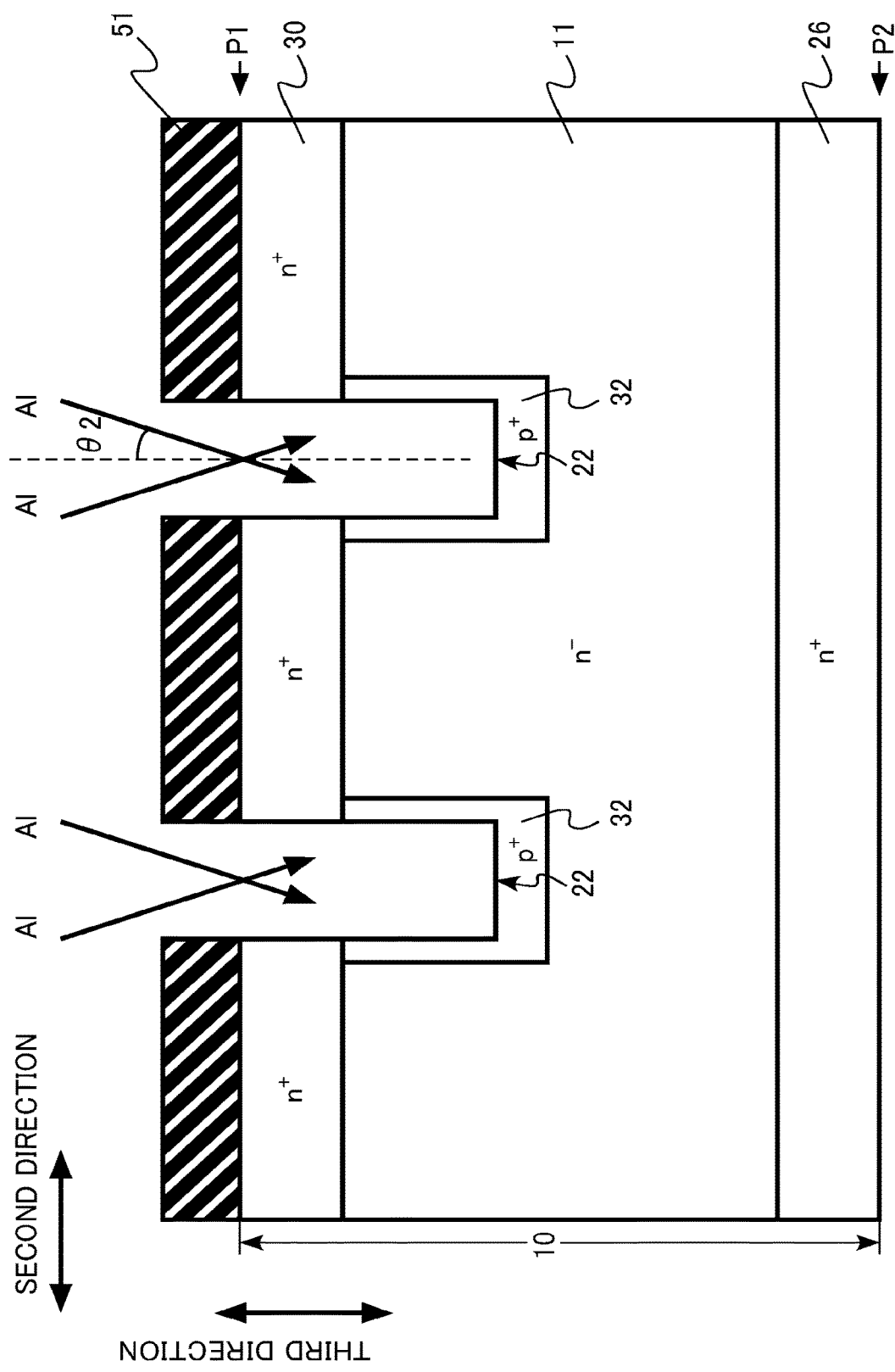
FIG. 19 is a schematic cross-sectional view illustrating an example of the method of manufacturing the semiconductor device according to the second embodiment.

Next, a $p^+$-type electric field relaxation region 32 is formed by using the mask material 51 as a mask (FIG. 19). The electric field relaxation region 32 is formed by implanting aluminum ions into the contact trench 22 by an oblique ion implantation method. Aluminum ions are implanted with p-type impurities in a direction inclined at a second angle ($\theta 2$ in FIG. 19) with respect to a normal line (dotted line in FIG. 19) of the first plane P1. The $p^+$-type electric field relaxation region 32 is formed near the side and bottom surfaces of the contact trench 22 in the silicon carbide layer 10.

Figure 20:
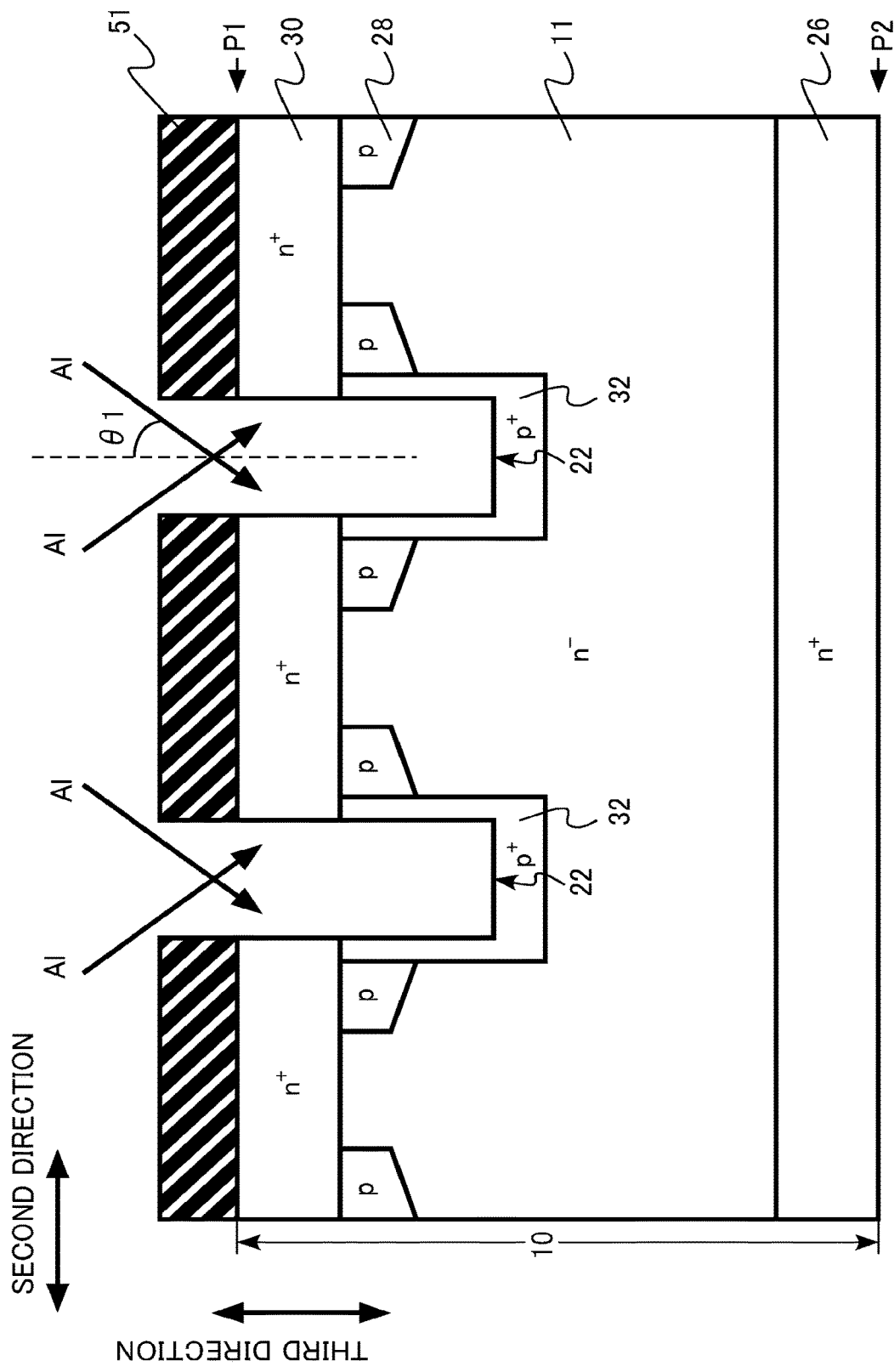
FIG. 20 is a schematic cross-sectional view illustrating an example of the method of manufacturing the semiconductor device according to the second embodiment.

Next, a p-type body region 28 is formed by using the mask material 51 as a mask (FIG. 20). The body region 28 is formed by implanting aluminum ions into the contact trench 22 by an oblique ion implantation method (FIG. 20). Aluminum ions are implanted with p-type impurities in a direction inclined at a first angle ($\theta 1$ in FIG. 20) with respect to a normal line (dotted line in FIG. 20) of the first plane P1.

The first angle $\theta 1$ is larger than the second angle $\theta 2$. In other words, the second angle $\theta 2$ is smaller than the first angle $\theta 1$.

Next, the mask material 51 is peeled off. Next, a mask material 53 is formed. The mask material 53 is, for example, a silicon oxide film. The mask material 53 covers the contact trench 22.

Figure 21:
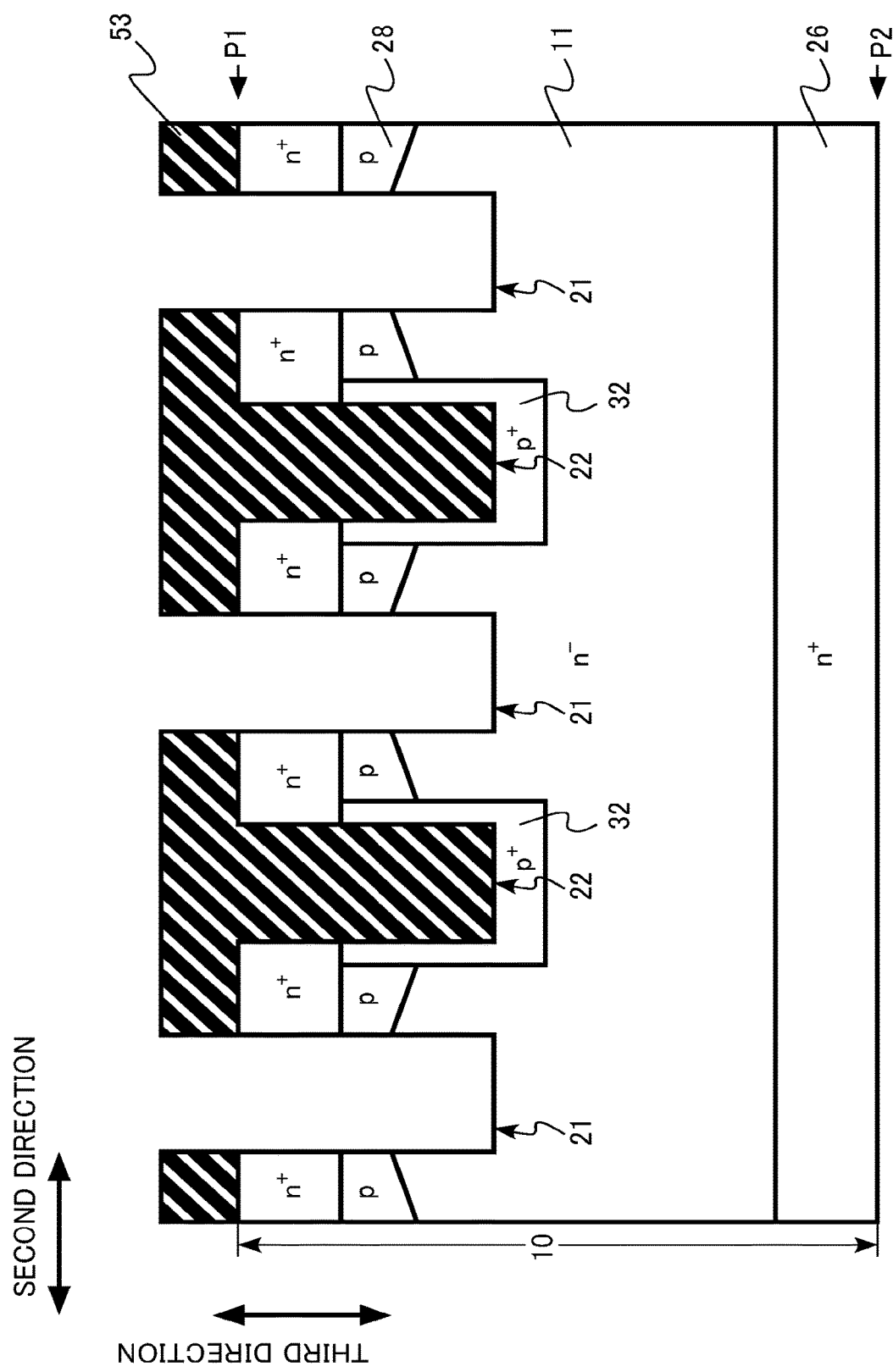
FIG. 21 is a schematic cross-sectional view illustrating an example of the method of manufacturing the semiconductor device according to the second embodiment.

Next, a gate trench 21 (first trench) is formed by using the mask material 53 as a mask (FIG. 21). The gate trench 21 is formed such that the body region 28 is in contact with the side surface of the gate trench 21.

Next, the mask material 53 is peeled off. After that, the MOSFET 100 illustrated in FIGS. 1 to 3 is manufactured by the same manufacturing method as the method of manufacturing the semiconductor device according to the first embodiment described with reference to FIGS. 10 to 16.

In the method of manufacturing the semiconductor device according to the second embodiment, unlike the method of manufacturing the semiconductor device according to the first embodiment, the gate trench 21 and the contact trench 22 can be formed independently. Therefore, for example, the contact trench 22 having a depth or a taper angle of the side surface different from that of the gate trench 21 can be easily formed.

As described above, according to the second embodiment, it is possible to realize a MOSFET capable of reducing the on-resistance.

Third Embodiment

A semiconductor device according to a third embodiment is different from the semiconductor device according to the first embodiment in that the semiconductor device according to the third embodiment further includes a fifth silicon carbide region of p-type located between the first trench and the first silicon carbide region. Hereinafter, a portion of contents overlapping with the semiconductor device according to the first embodiment may be omitted in description.

Figure 22:
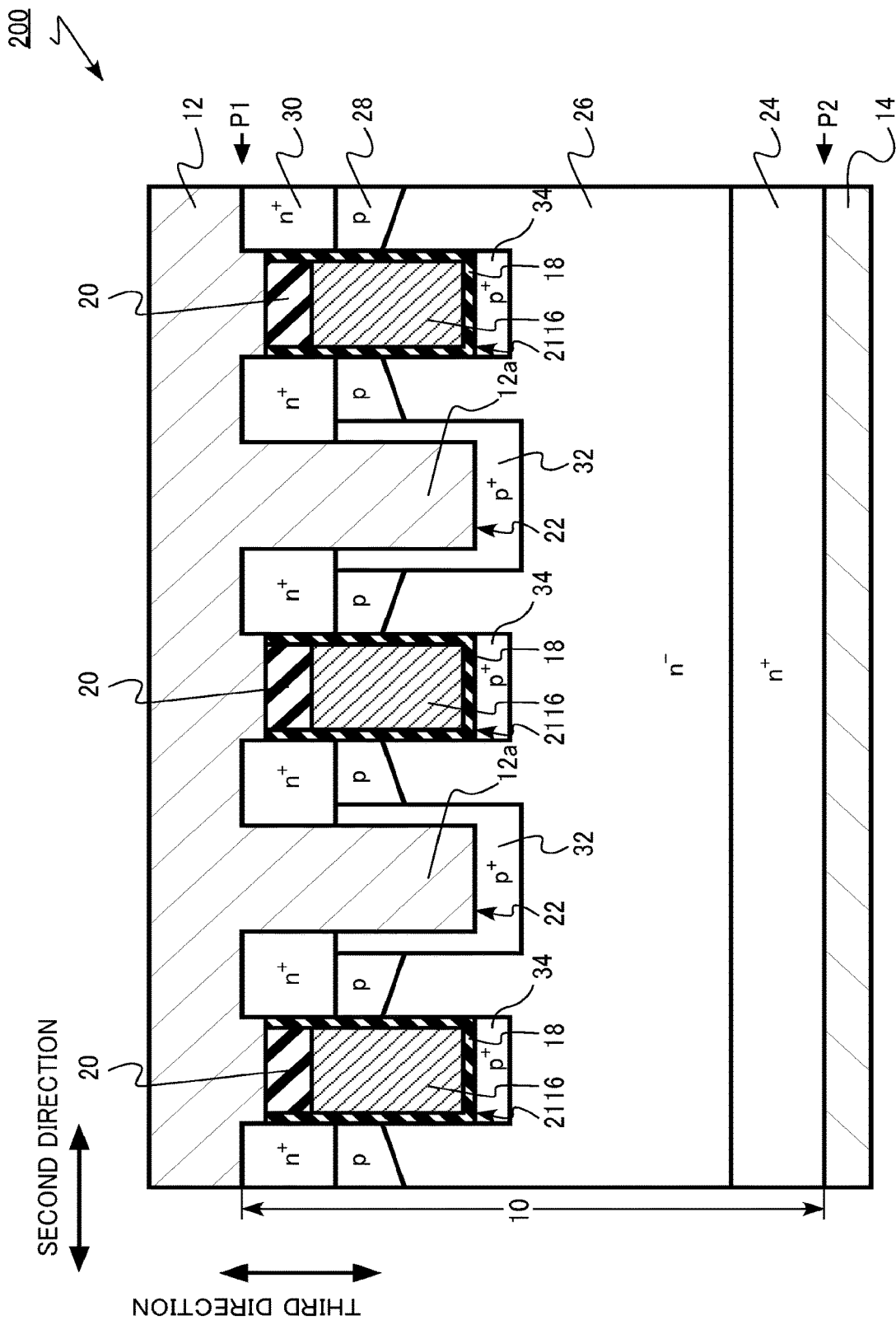
FIG. 22 is a schematic cross-sectional view of a semiconductor device according to a third embodiment.

FIG. 22 is a schematic cross-sectional view of the semiconductor device according to the third embodiment. FIG. 22 is a view corresponding to FIG. 1 of the first embodiment.

The semiconductor device according to the third embodiment is a vertical-type MOSFET 200 using silicon carbide. The MOSFET 200 is a MOSFET having a trench gate structure in which a gate electrode is provided in a trench. In addition, the MOSFET 200 is a MOSFET having a so-called double trench structure in which a source electrode is provided in a trench. In addition, the MOSFET 200 is an n-channel MOSFET using electrons as carriers.

The MOSFET 200 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 includes a gate trench 21 (first trench), a contact trench 22 (second trench), an $n^+$-type drain region 24, an $n^-$-type drift region 26 (first silicon carbide region), a p-type body region 28 (second silicon carbide region), an $n^+$-type source region 30 (third silicon carbide region), a $p^+$-type electric field relaxation region 32 (fourth silicon carbide region), and a $p^+$-type gate trench bottom region (fifth silicon carbide region).

The $p^+$-type gate trench bottom region 34 is located between the gate trench 21 and the drift region 26. The gate trench bottom region 34 is in contact with the bottom surface of the gate trench 21. The gate trench bottom region 34 is in contact with the gate insulating layer 18.

The gate trench bottom region 34 has a function of relaxing the electric field applied to the gate insulating layer 18 during the time of off-operation of the MOSFET 200.

The gate trench bottom region 34 contains, for example, aluminum (Al) as a p-type impurity. The p-type impurity concentration of the gate trench bottom region 34 is, for example, higher than the p-type impurity concentration of the body region 28. The p-type impurity concentration of the gate trench bottom region 34 is, for example, 10 times or more of the p-type impurity concentration of the body region 28.

For example, the p-type impurity concentration of the gate trench bottom region 34 is lower than the p-type impurity concentration of the electric field relaxation region 32. The p-type impurity concentration of the gate trench bottom region 34 is, for example, $5 \times 10^{17}$ cm$^{-3}$ or more and $5 \times 10^{19}$ cm$^{-3}$ or less.

The gate trench bottom region 34 can be formed, for example, by ion-implanting p-type impurities into the bottom of the gate trench 21 after the formation of the gate trench 21.

Since the MOSFET 200 includes the gate trench bottom region 34, the reliability of the gate insulating layer 18 is improved.

As described above, according to the third embodiment, it is possible to realize a MOSFET that can reduce the on-resistance. In addition, it is possible to realize a MOSFET with improved reliability of the gate insulating layer.

Fourth Embodiment

A semiconductor device according to a fourth embodiment is different from the semiconductor device according to the first embodiment in that the width of the first trench in the second direction is smaller than the width of the second trench in the second direction. In addition, the semiconductor device according to the fourth embodiment is different from the semiconductor device according to the first embodiment in that the distance from the second plane to the first trench is larger than the distance from the second plane to the second trench. Hereinafter, a portion of contents overlapping with the semiconductor device according to the first embodiment may be omitted in description.

The semiconductor device according to the fourth embodiment is a vertical-type MOSFET 300 using silicon carbide. The MOSFET 300 is a MOSFET having a trench gate structure in which a gate electrode is provided in a trench. The MOSFET 300 is a MOSFET having a so-called double trench structure in which a source electrode is provided in a trench. The MOSFET 300 is an n-channel MOSFET using electrons as carriers.

Figure 23:
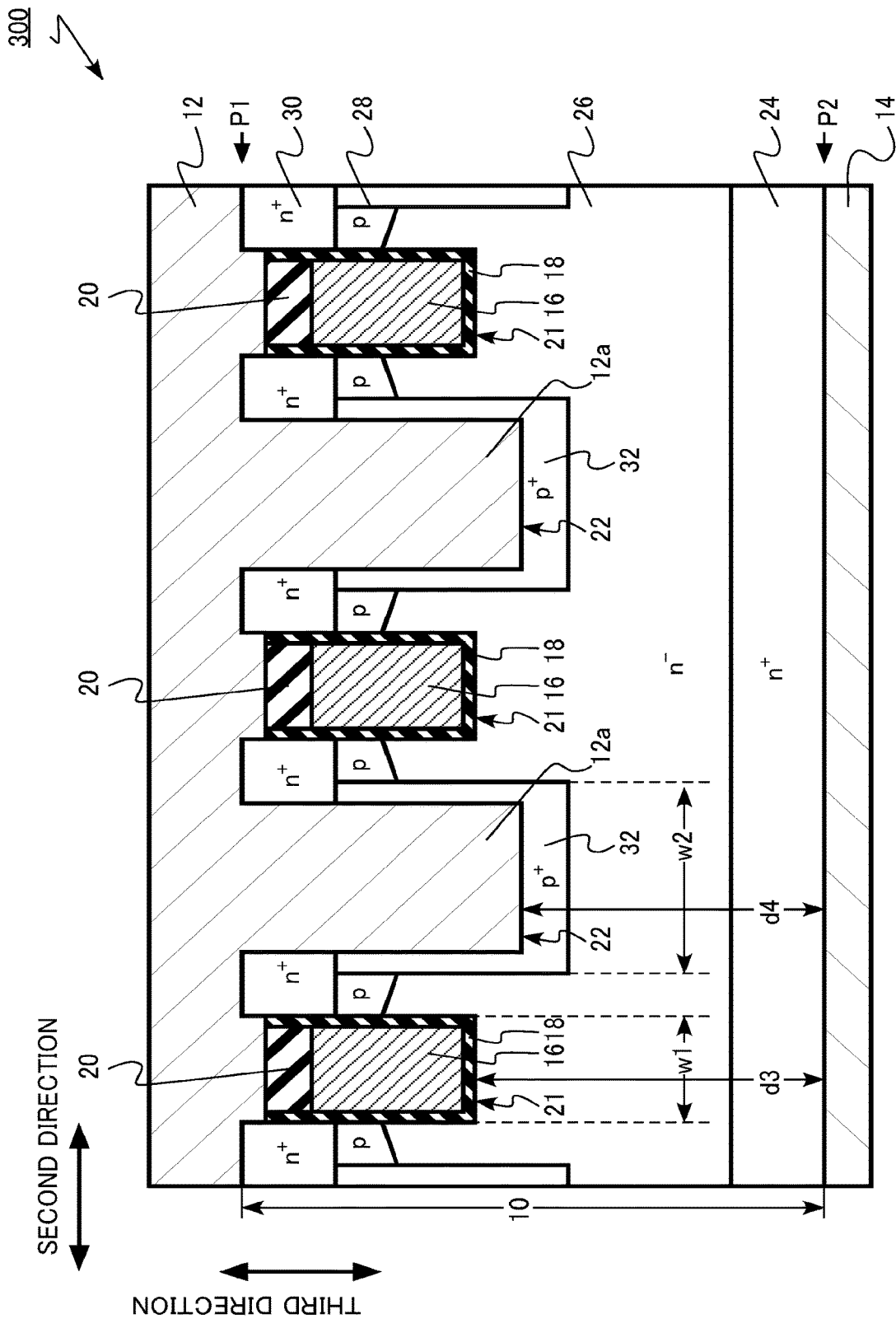
FIG. 23 is a schematic cross-sectional view of a semiconductor device according to a fourth embodiment.

FIG. 23 is a schematic cross-sectional view of the semiconductor device according to the fourth embodiment. FIG. 23 is a view corresponding to FIG. 1 of the first embodiment.

The MOSFET 300 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 includes a gate trench 21 (first trench), a contact trench 22 (second trench), an n$^+$-type drain region 24, an n$^-$-type drift region 26 (first silicon carbide region), a p-type body region 28 (second silicon carbide region), an n$^+$-type source region 30 (third silicon carbide region), and a p$^+$-type electric field relaxation region 32 (fourth silicon carbide region).

The width (w1 in FIG. 23) of the gate trench 21 in the second direction is smaller than the width (w2 in FIG. 23) of the contact trench 22 in the second direction. In other words, the width w2 of the contact trench 22 is larger than the width w1 of the gate trench 21.

The distance (d3 in FIG. 23) from the second plane P2 to the gate trench 21 is larger than the distance (d4 in FIG. 23) from the second plane P2 to the contact trench 22. In other words, the depth of the contact trench 22 is larger than the depth of the gate trench 21.

According to the MOSFET 300, for example, since the width w2 of the contact trench 22 is large, the body region 28 can be easily formed by oblique ion implantation. In addition, the contact region 12a can be easily buried in the contact trench 22.

According to the MOSFET 300, since the depth of the contact trench 22 is large, the electric field applied to the gate insulating layer 18 is further relaxed. Therefore, the reliability of the gate insulating layer 18 is improved.

As described above, according to the fourth embodiment, it is possible to realize a MOSFET that can reduce the on-resistance. In addition, it is possible to realize a MOS-FET that can be easily manufactured. In addition, it is possible to realize a MOSFET with improved reliability of the gate insulating layer.

Fifth Embodiment

An inverter circuit and a driving device according to a fifth embodiment are driving devices including the semiconductor device according to the first embodiment.

Figure 24:
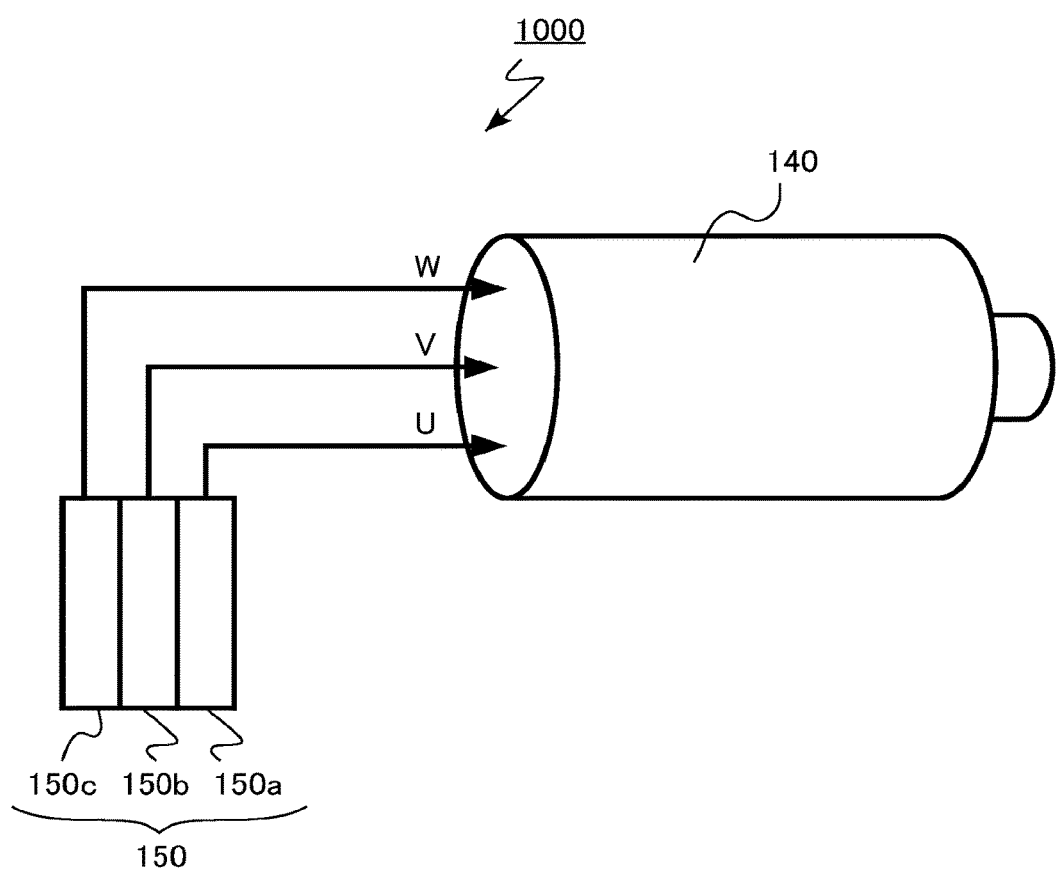
FIG. 24 is a schematic view of a driving device according to a fifth embodiment.

FIG. 24 is a schematic view of the driving device according to the fifth embodiment. The driving device 1000 includes a motor 140 and an inverter circuit 150.

The inverter circuit 150 is configured with three semiconductor modules 150a, 150b, and 150c using the MOSFET 100 according to the first embodiment as a switching element. By connecting the three semiconductor modules 150a, 150b, 150c in parallel, a three-phase inverter circuit 150 having three AC voltage output terminals U, V, and W is realized. The motor 140 is driven by the AC voltage output from the inverter circuit 150.

According to the fifth embodiment, by providing the MOSFET 100 with improved characteristics, the characteristics of the inverter circuit 150 and the driving device 1000 are improved.

Sixth Embodiment

A vehicle according to a sixth embodiment is a vehicle including the semiconductor device according to the first embodiment.

Figure 25:
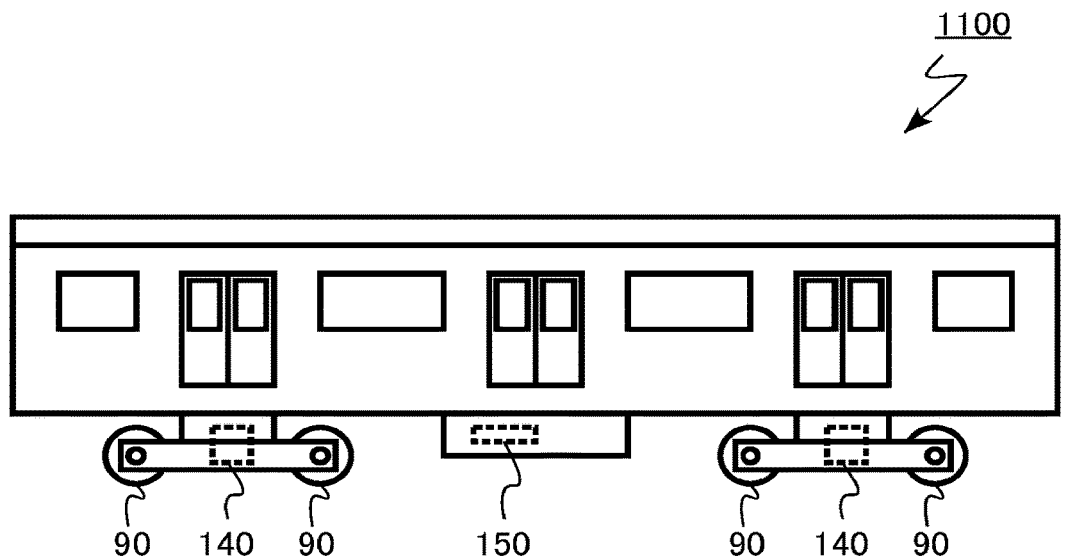
FIG. 25 is a schematic view of a vehicle according to a sixth embodiment.

FIG. 25 is a schematic view of a vehicle according to the sixth embodiment. The vehicle 1100 according to the sixth embodiment is a railway vehicle. The vehicle 1100 includes a motor 140 and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized. The motor 140 is driven by the AC voltage output from the inverter circuit 150. The wheels 90 of the vehicle 1100 are rotated by the motor 140.

According to the sixth embodiment, by providing the MOSFET 100 with improved characteristics, the characteristics of the vehicle 1100 are improved.

Seventh Embodiment

A vehicle according to a seventh embodiment is a vehicle including the semiconductor device according to the first embodiment.

Figure 26:
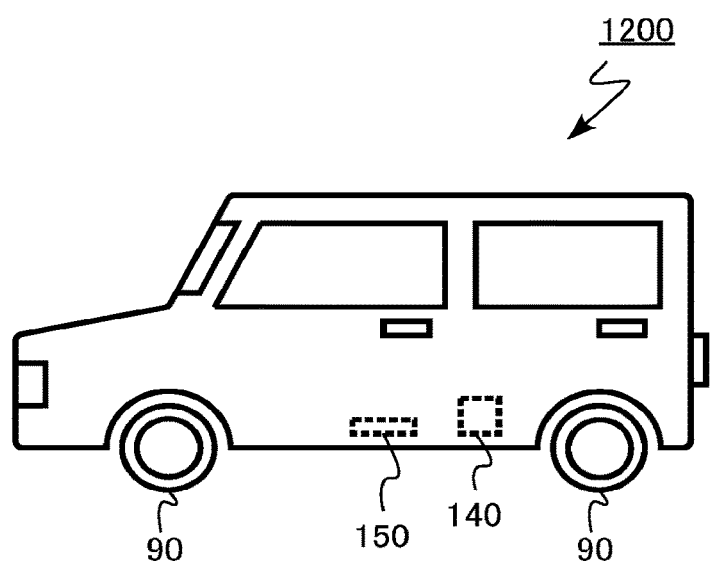
FIG. 26 is a schematic view of a vehicle according to a seventh embodiment.

FIG. 26 is a schematic view of a vehicle according to the seventh embodiment. The vehicle 1200 according to the seventh embodiment is an automobile. The vehicle 1200 includes a motor 140 and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized.

The motor 140 is driven by the AC voltage output from the inverter circuit 150. The wheels 90 of the vehicle 1200 are rotated by the motor 140.

According to the seventh embodiment, by providing the MOSFET 100 with improved characteristics, the characteristics of the vehicle 1200 are improved.

Eighth Embodiment

An elevator according to an eighth embodiment is an elevator including the semiconductor device according to the first embodiment.

Figure 27:
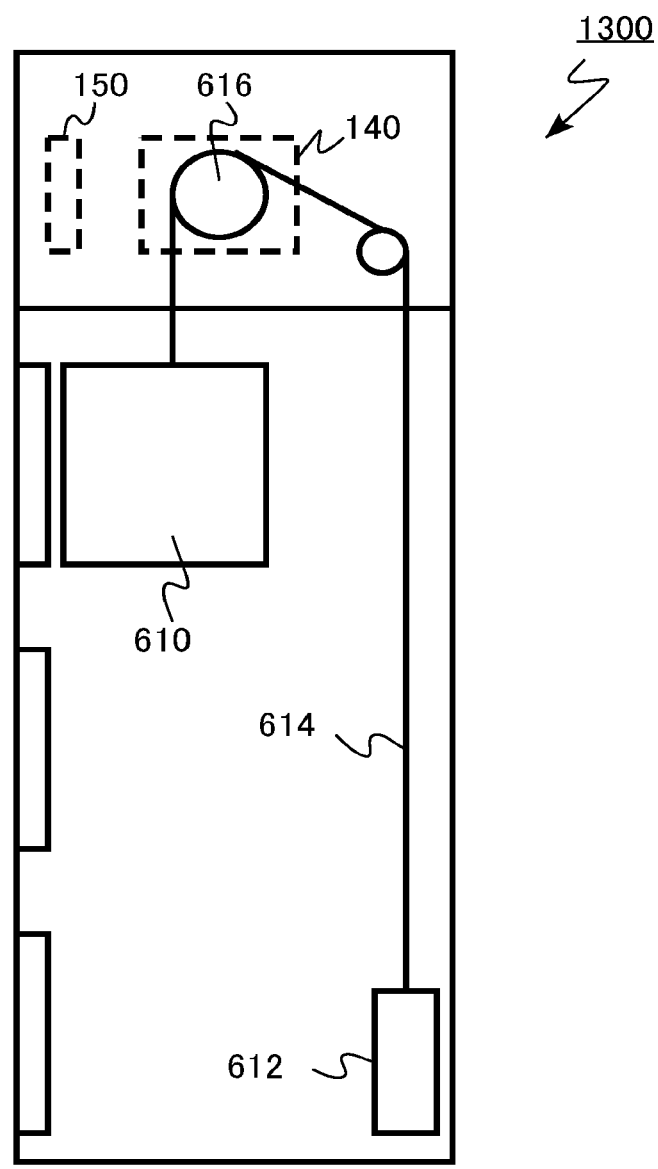
FIG. 27 is a schematic view of an elevator according to an eighth embodiment.

FIG. 27 is a schematic view of an elevator (lift) according to the eighth embodiment. The elevator 1300 according to the eighth embodiment includes a basket 610, a counterweight 612, a wire rope 614, a hoist 616, a motor 140, and an inverter circuit 150.

The inverter circuit 150 is configured with three semiconductor modules using the MOSFET 100 according to the first embodiment as a switching element. By connecting three semiconductor modules in parallel, a three-phase inverter circuit 150 having three AC voltage output terminals U, V, and W is realized.

The motor 140 is driven by the AC voltage output from the inverter circuit 150. The hoist 616 is rotated by the motor 140, and the basket 610 is raised and lowered.

According to the eighth embodiment, by providing the MOSFET 100 with improved characteristics, the characteristics of the elevator 1300 are improved.

As described above, in the first to fourth embodiments, a case where the crystal structure of silicon carbide is 4H—SiC has been described as an example, but the embodiments can be applied to silicon carbides with other crystal structures such as 6H—SiC and 3C—SiC.

In addition, in the fifth to eighth embodiments, a case where the semiconductor device according to the first embodiment is provided has been described as an example, but the semiconductor device according to the third or fourth embodiment can be applied.

In addition, in the fifth to eighth embodiments, a case where the semiconductor device according to the embodiments is applied to a vehicle or an elevator has been described as an example, but the semiconductor device according to the embodiments can be applied to, for example, a power conditioner or the like of a solar power generation system.

While certain embodiments have been described, these embodiments have been presented by way of example only, and are not intended to limit the scope of the inventions. Indeed, semiconductor devices, methods of manufacturing a semiconductor device, inverter circuits, driving devices, vehicles, and elevators described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane parallel to a first direction and a second direction perpendicular to the first direction and a second plane facing the first plane, the silicon carbide layer having
   a first trench being located on a side of the first plane and extending in the first direction,
   a second trench being located on the side of the first plane and extending in the first direction,
   a first silicon carbide region of n-type,
   a second silicon carbide region of p-type being located between the first silicon carbide region and the first plane and being located between the first trench and the second trench,
   a third silicon carbide region of n-type being located between the second silicon carbide region and the first plane and being located between the first trench and the second trench, and
   a fourth silicon carbide region of p-type being located between the second trench and the first silicon carbide region, the fourth silicon carbide region being located between the second trench and the second silicon carbide region, and the fourth silicon carbide region having higher p-type impurity concentration than the second silicon carbide region;
   a gate electrode being located in the first trench;
   a gate insulating layer being located between the gate electrode and the silicon carbide layer;
   a first electrode being located on a side of the first plane of the silicon carbide layer, a portion of the first electrode being located in the second trench, and a portion of the first electrode being in contact with the third silicon carbide region and the fourth silicon carbide region;
   a second electrode being located on a side of the second plane of the silicon carbide layer; and
   an interlayer insulating layer being located between the gate electrode and the first electrode,
   wherein an impurity concentration distribution of a p-type impurity in the second silicon carbide region in the second direction has a concentration peak between the first trench and the second trench, and a p-type impurity concentration in a portion between a position of the concentration peak and the first trench is lower than a p-type impurity concentration in a portion between the position of the concentration peak and the second trench.

2. A semiconductor device comprising:
   a silicon carbide layer having a first plane parallel to a first direction and a second direction perpendicular to the first direction and a second plane facing the first plane, the silicon carbide layer having
   a first trench being located on a side of the first plane and extending in the first direction,
   a second trench being located on the side of the first plane and extending in the first direction,
   a first silicon carbide region of n-type,
   a second silicon carbide region of p-type being located between the first silicon carbide region and the first plane and being located between the first trench and the second trench,
   a third silicon carbide region of n-type being located between the second silicon carbide region and the first plane and being located between the first trench and the second trench, and
   a fourth silicon carbide region of p-type being located between the second trench and the first silicon carbide region, the fourth silicon carbide region being located between the second trench and the second silicon carbide region, and the fourth silicon carbide region having higher p-type impurity concentration than the second silicon carbide region;
   a gate electrode being located in the first trench;
   a gate insulating layer being located between the gate electrode and the silicon carbide layer;
   a first electrode being located on a side of the first plane of the silicon carbide layer, a portion of the first electrode being located in the second trench, and a portion of the first electrode being in contact with the third silicon carbide region and the fourth silicon carbide region;

a second electrode being located on a side of the second plane of the silicon carbide layer; and an interlayer insulating layer being located between the gate electrode and the first electrode, wherein an interface between the first electrode and the interlayer insulating layer is located in the first trench, wherein an impurity concentration distribution of a p-type impurity in the second silicon carbide region in the second direction has a concentration peak between the first trench and the second trench, and a p-type impurity concentration in a portion between a position of the concentration peak and the first trench is lower than a p-type impurity concentration in a portion between the position of the concentration peak and the second trench.

3. The semiconductor device according to claim 2, wherein, in a case where a boundary between the second silicon carbide region and the third silicon carbide region is denoted by a first boundary, a distance from the first plane to the first boundary is denoted by a first distance, a boundary between the first silicon carbide region and the second silicon carbide region is denoted by a second boundary, a distance from the first boundary to the second boundary is denoted by a second distance, the first distance is substantially constant, and the first distance along the gate insulating layer is larger than the second distance along the gate insulating layer.

4. The semiconductor device according to claim 2, wherein in a case where a boundary between the first silicon carbide region and the second silicon carbide region is denoted by a second boundary, and a distance from the first plane to the second boundary is denoted by a third distance, the third distance increases from the first trench toward the second trench.

5. The semiconductor device according to claim 2, wherein a distance between the first trench and the second trench is smaller than a width of the first trench in the second direction.

6. The semiconductor device according to claim 2, wherein a distance from the second plane to the first trench is substantially equal to a distance from the second plane to the second trench.

7. The semiconductor device according to claim 2, further comprising a fifth silicon carbide region of p-type located between the first trench and the first silicon carbide region.

8. The semiconductor device according to claim 2, wherein a width of the first trench in the second direction is smaller than a width of the second trench in the second direction.

9. An inverter circuit comprising the semiconductor device according to claim 2.

10. A driving device comprising the semiconductor device according to claim 2.

11. A vehicle comprising the semiconductor device according to claim 2.

12. An elevator comprising the semiconductor device according to claim 2.

* * * * *